United States Patent
Hanaoka

(10) Patent No.: US 8,404,563 B2
(45) Date of Patent: Mar. 26, 2013

(54) METHOD FOR REPROCESSING SEMICONDUCTOR SUBSTRATE AND METHOD FOR MANUFACTURING SOI SUBSTRATE

(75) Inventor: Kazuya Hanaoka, Fujisawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/820,181

(22) Filed: Jun. 22, 2010

(65) Prior Publication Data

US 2010/0330778 A1 Dec. 30, 2010

(30) Foreign Application Priority Data

Jun. 24, 2009 (JP) ................. 2009-149412

(51) Int. Cl.
*H01L 21/762* (2006.01)
(52) U.S. Cl. ................. 438/458; 257/E21.568
(58) Field of Classification Search .......... 438/455–459, 438/464, 745, 749; 257/E21.568
See application file for complete search history.

(56) References Cited

U.S. PATENT DOCUMENTS

| | | | |
|---|---|---|---|
| 4,517,106 A | 5/1985 | Hopkins et al. | |
| 4,731,516 A | 3/1988 | Noguchi et al. | |
| 5,494,849 A * | 2/1996 | Iyer et al. | 438/459 |
| 5,840,616 A * | 11/1998 | Sakaguchi et al. | 438/459 |
| 5,969,398 A | 10/1999 | Murakami | |
| 6,010,579 A | 1/2000 | Henley et al. | |
| 6,110,845 A | 8/2000 | Seguchi et al. | |
| 6,245,645 B1 | 6/2001 | Mitani et al. | |
| 6,335,231 B1 | 1/2002 | Yamazaki et al. | |
| 6,344,404 B1 * | 2/2002 | Cheung et al. | 438/513 |
| 6,380,046 B1 | 4/2002 | Yamazaki | |
| 6,426,270 B1 | 7/2002 | Sakaguchi et al. | |
| 6,521,492 B2 | 2/2003 | Miyasaka et al. | |
| 6,548,382 B1 | 4/2003 | Henley et al. | |
| 6,596,610 B1 | 7/2003 | Kuwabara et al. | |

(Continued)

FOREIGN PATENT DOCUMENTS

| | | |
|---|---|---|
| EP | 0961312 | 12/1999 |
| EP | 1156531 | 11/2001 |

(Continued)

OTHER PUBLICATIONS

Kriegler et al., "The Effect of HCl and $Cl_2$ on the Thermal Oxidation of Silicon," *J. Electorchem. Soc.: Solid-State Science and Technology*, Mar. 1972, 119 (3), pp. 388-392.

(Continued)

*Primary Examiner* — Savitr Mulpuri
(74) *Attorney, Agent, or Firm* — Eric J. Robinson; Robinson Intellectual Property Law Office, P.C.

(57) ABSTRACT

The embrittlement layer and the semiconductor layer remaining on the periphery of the semiconductor substrate after separation are selectively removed using a mixed solution containing a substance functioning as an oxidizer for oxidizing a semiconductor, a substance dissolving an oxide of a semiconductor, and a substance functioning as a decelerator of oxidization of a semiconductor and dissolution of an oxide of a semiconductor. Note that the semiconductor film is separated from the semiconductor substrate along an embrittlement layer that is formed in the semiconductor substrate by implantation of an $H^+$ ion generated from a hydrogen gas with use of an ion implantation apparatus.

21 Claims, 7 Drawing Sheets

U.S. PATENT DOCUMENTS

| | | |
|---|---|---|
| 6,613,678 B1 | 9/2003 | Sakaguchi et al. |
| 6,716,722 B1 | 4/2004 | Furihata et al. |
| 6,875,633 B2 | 4/2005 | Fukunaga |
| 6,927,148 B2 | 8/2005 | Ito |
| 7,022,586 B2 | 4/2006 | Maleville et al. |
| 7,064,049 B2 | 6/2006 | Ito et al. |
| 7,119,365 B2 | 10/2006 | Takafuji et al. |
| 7,402,520 B2 * | 7/2008 | Donohoe et al. ............... 438/690 |
| 7,442,623 B2 | 10/2008 | Endo et al. |
| 7,531,425 B2 * | 5/2009 | Nakano et al. ................ 438/455 |
| 7,749,908 B2 * | 7/2010 | Maleville ...................... 438/692 |
| 7,763,541 B2 | 7/2010 | Okuda et al. |
| 7,767,549 B2 * | 8/2010 | Okuda et al. .................. 438/459 |
| 7,867,877 B2 * | 1/2011 | Morita et al. .................. 438/459 |
| 7,951,718 B2 * | 5/2011 | Donohoe et al. ............... 438/692 |
| 2001/0046746 A1 | 11/2001 | Yokokawa et al. |
| 2002/0048844 A1 | 4/2002 | Sakaguchi |
| 2002/0157790 A1 | 10/2002 | Abe et al. |
| 2003/0124815 A1 * | 7/2003 | Henley et al. .................. 438/460 |
| 2003/0170990 A1 | 9/2003 | Sakaguchi et al. |
| 2005/0070073 A1 | 3/2005 | Al-Bayati et al. |
| 2005/0079712 A1 | 4/2005 | Tong et al. |
| 2006/0099776 A1 | 5/2006 | Dupont |
| 2006/0099791 A1 | 5/2006 | Mitani et al. |
| 2006/0148208 A1 | 7/2006 | Popov et al. |
| 2006/0177993 A1 | 8/2006 | Endo et al. |
| 2007/0141803 A1 | 6/2007 | Boussagol et al. |
| 2007/0148912 A1 | 6/2007 | Morita et al. |
| 2007/0148914 A1 | 6/2007 | Morita et al. |
| 2007/0249139 A1 * | 10/2007 | Gadkaree et al. ............. 438/458 |
| 2007/0281172 A1 | 12/2007 | Couillard et al. |
| 2007/0281399 A1 | 12/2007 | Cites et al. |
| 2008/0124929 A1 | 5/2008 | Okuda et al. |
| 2008/0153272 A1 | 6/2008 | Akiyama et al. |
| 2008/0233725 A1 | 9/2008 | Forbes |
| 2008/0280420 A1 | 11/2008 | Yamazaki |
| 2009/0081848 A1 | 3/2009 | Erokhin et al. |
| 2009/0093102 A1 | 4/2009 | Moriwaka |
| 2009/0098704 A1 | 4/2009 | Ohnuma et al. |
| 2009/0111245 A1 * | 4/2009 | Okabe et al. .................. 438/459 |
| 2009/0115028 A1 | 5/2009 | Shimomura et al. |
| 2009/0280621 A1 | 11/2009 | Endo et al. |
| 2010/0022070 A1 | 1/2010 | Imahayashi |
| 2010/0330777 A1 * | 12/2010 | Hanaoka ...................... 438/458 |
| 2011/0086492 A1 * | 4/2011 | Ohnuma et al. ............... 438/455 |

FOREIGN PATENT DOCUMENTS

| | | |
|---|---|---|
| EP | 1202339 | 5/2002 |
| EP | 1427001 | 6/2004 |
| EP | 1427002 | 6/2004 |
| EP | 1791174 | 5/2007 |
| EP | 2091075 | 8/2009 |
| JP | 2000-036583 | 2/2000 |
| JP | 2000-223682 | 8/2000 |
| JP | 2001-155978 | 6/2001 |
| JP | 2002-134375 | 5/2002 |
| JP | 2004-087606 | 3/2004 |
| JP | 2004-260137 | 9/2004 |
| JP | 2005-072070 | 3/2005 |
| JP | 2007-149907 | 6/2007 |
| JP | 3932369 | 6/2007 |
| JP | 2009-135437 | 6/2009 |

OTHER PUBLICATIONS

Vossen et al., "Thin film processes II," Academic Press, pp. 317-323, 1991.

Lu et al., "Ion-cut silicon-on-insulator fabrication with plasma immersion ion implantation," *Appl. Phys. Lett.*, Nov. 10, 1997, 71 (19), pp. 2767-2769.

International Search Report (Application No. PCT/JP2010/059996) Dated Jul. 13, 2010.

Written Opinion (Application No. PCT/JP2010/059996) Dated Jul. 13, 2010.

* cited by examiner

METHOD FOR REPROCESSING SEMICONDUCTOR SUBSTRATE AND METHOD FOR MANUFACTURING SOI SUBSTRATE

TECHNICAL FIELD

The present invention relates to a method for reprocessing a semiconductor substrate by-produced in manufacture of an SOI (silicon on insulator) substrate, and a method for manufacturing an SOI substrate.

BACKGROUND ART

In recent years, integrated circuits using an SOI (silicon on insulator) substrate that includes a thin single crystal semiconductor layer formed on an insulating surface have been developed instead of those using a bulk silicon wafer. The characteristics of the thin single crystal silicon film formed on the insulating surface make it possible to completely separate transistors formed in the integrated circuit. In addition, fully-depleted transistors can be obtained, thereby realizing a semiconductor integrated circuit with high added value such as high integration, high-speed driving, and low power consumption.

One of the known methods for manufacturing an SOI substrate is Smart Cut (registered trademark). The use of Smart Cut allows an SOI substrate having a single crystal silicon film to be manufactured not only on a silicon substrate but also on an insulating substrate such as a glass substrate (for example, see Patent Document 1). An SOI substrate having a single crystal silicon thin film formed on a glass substrate is generally manufactured by Smart cut as follows. First, a silicon dioxide film is formed on a surface of a single crystal silicon wafer. Next, hydrogen ions are implanted into the single crystal silicon wafer to form a hydrogen ion-implanted layer at a predetermined depth in the single crystal silicon wafer. Then, the single crystal silicon wafer into which the hydrogen ions have been implanted is bonded to a glass substrate with the silicon dioxide film interposed therebetween. After that, a heat treatment is performed, whereby a thin film of the single crystal silicon wafer into which the hydrogen ions have been implanted is separated with the hydrogen ion-implanted layer serving as a cleavage plane. Thus, a single crystal silicon thin film can be formed on the bonded glass substrate. Smart Cut is also referred to as a hydrogen ion implantation separation method.

REFERENCE

[Patent Document 1] Japanese Published Patent Application No. 2004-87606

DISCLOSURE OF INVENTION

When an SOI substrate is manufactured by Smart Cut, a semiconductor substrate (a bond substrate) is boned to a base substrate and then the semiconductor substrate is separated, whereby a thin semiconductor film is formed on the base substrate. Most part of the semiconductor substrate which has been bonded is separated from the base substrate. However, by performing a reprocessing treatment on the semiconductor substrate separated from the base substrate (a semiconductor substrate after separation), the semiconductor substrate after separation can be reused as a semiconductor substrate used for manufacturing an SOI substrate. By repeating the above steps, a plurality of semiconductor films for SOI substrates can be formed using one semiconductor substrate, resulting in cost reduction and high production efficiency of the SOI substrate.

When a semiconductor substrate such as a commercially available single crystal silicon wafer is polished, a portion called edge roll off (ERO), which has a thickness smaller than that of the center of the substrate, occurs in the periphery of the substrate. This makes it difficult to bond the peripheral portion of the semiconductor substrate to a base substrate.

Thus, a semiconductor layer and an insulating film that should be bonded to the base substrate remain as a projecting portion on the periphery of the semiconductor substrate from which a thin semiconductor film on the base substrate has been separated.

The projecting portion on the periphery of the semiconductor substrate can be removed by chemical mechanical polishing (CMP) so that the semiconductor substrate is planarized. However, since the CMP is a method of mechanically polishing the surface of the substrate, complete removal of the projecting portion on the periphery of the semiconductor substrate after separation causes a problem of an increase in the thickness of a polished portion of the semiconductor substrate. That is, the thickness of a removed portion of the semiconductor substrate is increased in a reprocessing treatment process, which leads to a reduction in the number of times of reprocessing and reusing one semiconductor substrate, and thus to an increase in cost.

In view of the above problems, an object of one embodiment of the present invention is to provide a method for reprocessing a semiconductor substrate after separation from which a semiconductor film has been separated, by which a reprocessed semiconductor substrate capable of being used for manufacturing an SOI substrate is obtained with a smaller thickness of a removed portion of the semiconductor substrate after separation and the number of times of reprocessing and reusing one semiconductor substrate is increased.

In the method for reprocessing a semiconductor substrate of one embodiment of the present invention, an insulating film remaining on the periphery of a semiconductor substrate after separation is removed by a first etching treatment, and an embrittlement layer and a semiconductor layer remaining on the periphery of the semiconductor substrate after separation are selectively removed by a second etching treatment using as an etchant a mixed solution containing a substance functioning as an oxidizer for oxidizing a semiconductor of the semiconductor substrate, a substance dissolving the oxide of the semiconductor, and a substance functioning as a decelerator of oxidization of the semiconductor and dissolution of the oxide of the semiconductor.

One embodiment of the invention disclosed in this specification is a method for reprocessing a semiconductor substrate after separation that is by-produced when a base substrate is bonded to a semiconductor substrate into which an H$^+$ ion is implanted by a hydrogen ion implantation separation method and a semiconductor film separated from the semiconductor substrate is formed on the base substrate. An embrittlement layer, a semiconductor layer, and an insulating film remain on the periphery of the semiconductor substrate after separation. The remaining insulating film is removed by a first etching treatment. The remaining embrittlement layer and semiconductor layer are removed by a second etching treatment using as an etchant a mixed solution containing a substance functioning as an oxidizer for oxidizing a semiconductor substrate, a substance dissolving the oxide of the semiconductor substrate, and a substance functioning as a decelerator of oxidization of the semiconductor and dissolution of the oxide of the semiconductor.

Another embodiment of the invention disclosed in this specification is a method for reprocessing a semiconductor substrate after separation that is by-produced when a base substrate is bonded to a semiconductor substrate into which an $H^+$ ion is implanted by a hydrogen ion implantation separation method and a semiconductor film separated from the semiconductor substrate is formed on the base substrate. An embrittlement layer, a semiconductor layer, and an insulating film remain on the periphery of the semiconductor substrate after separation. The remaining insulating film is removed by a first etching treatment. The remaining embrittlement layer and semiconductor layer are removed by a second etching treatment using as an etchant a mixed solution containing a substance functioning as an oxidizer for oxidizing a semiconductor of the semiconductor substrate, a substance dissolving the oxide of the semiconductor, and a substance functioning as a decelerator of oxidization of the semiconductor and dissolution of the oxide of the semiconductor.

In the above structure, the semiconductor substrate may be further subjected to a planarization treatment after the second etching treatment. The planarization treatment can be performed by a polishing treatment or a laser irradiation treatment. The polishing treatment and the laser irradiation treatment may be performed in combination, and there is no limitation on the order of the treatment steps.

Another embodiment of the invention disclosed in this specification is a method for manufacturing an SOI substrate in which an insulating film is formed over a semiconductor substrate, an embrittlement layer is formed by implanting an $H^+$ ion from a surface of the semiconductor substrate by a hydrogen ion implantation separation method, the semiconductor substrate is bonded to a base substrate with the insulating film interposed therebetween, and the semiconductor substrate is divided along the embrittlement layer into a semiconductor film formed on the base substrate with the insulating film interposed therebetween and a semiconductor substrate after separation. An embrittlement layer, a semiconductor layer, and an insulating film remain on the periphery of the semiconductor substrate after separation. The remaining insulating film is removed by a first etching treatment. The remaining embrittlement layer and semiconductor layer are removed by a second etching treatment using as an etchant a mixed solution containing a substance functioning as an oxidizer for oxidizing a semiconductor of the semiconductor substrate, a substance dissolving the oxide of the semiconductor, and a substance functioning as a decelerator of oxidization of the semiconductor and dissolution of the oxide of the semiconductor. The semiconductor substrate after separation is polished to form a reprocessed semiconductor substrate, and the reprocessed semiconductor substrate is reused as a semiconductor substrate.

In the above structures, the etchant used in the second etching treatment can be a mixed solution which contains: nitric acid as the substance functioning as an oxidizer for oxidizing a semiconductor; hydrofluoric acid as the substance dissolving an oxide of a semiconductor; and acetic acid as the substance functioning as a decelerator of oxidization of a semiconductor and dissolution of an oxide of a semiconductor. In that case, the mixture ratio of the mixed solution is preferably such that the volume of hydrofluoric acid is more than 0.01 times and less than 0.3 times as large as that of acetic acid, and the volume of nitric acid is more than 0.01 times and less than one time as large as that of acetic acid and is more than 0.1 times and less than 100 times as large as that of hydrofluoric acid.

According to one embodiment of the present invention, the embrittlement layer and the semiconductor layer remaining on the periphery of the semiconductor substrate after separation can be selectively removed, resulting in a reduction in the thickness of a removed portion of the semiconductor substrate after separation, and an increase in the number of times of reprocessing and reusing one semiconductor substrate.

BEST MODE FOR CARRYING OUT THE INVENTION

Figure 1A:
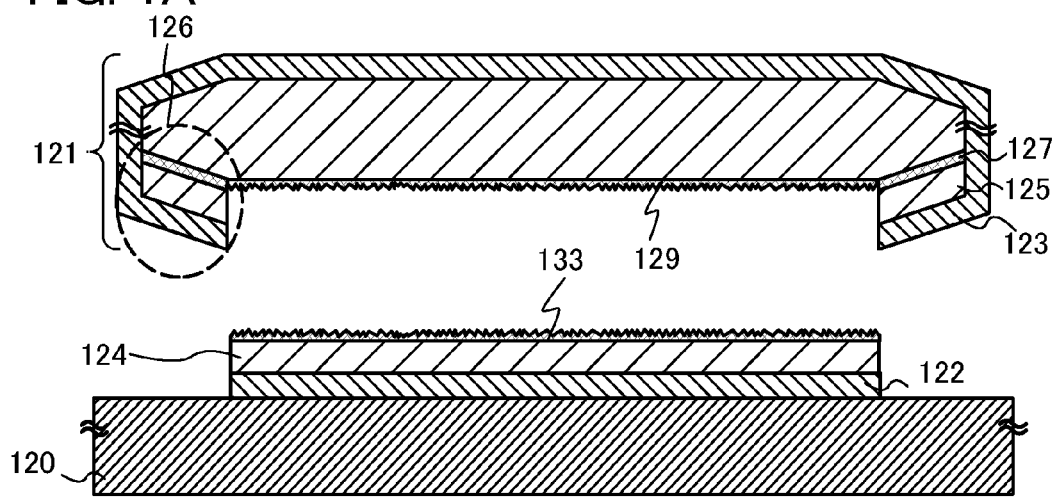
FIGS. 1A to 1D illustrate a method for reprocessing a semiconductor substrate after separation according to one embodiment of the present invention.

Embodiments of the present invention will be described below with reference to drawings. Note that the present invention can be implemented in a wide variety of modes, and it is apparent to those skilled in the art that modes and details can be modified without departing from the spirit and scope of the present invention. Accordingly, the present invention should not be construed as being limited to the description of the embodiments given below. Note that in all the drawings in this specification, like portions or portions having a similar function are denoted by like reference numerals, and the description thereof is omitted.

Embodiment 1

In this embodiment, a method for reprocessing a semiconductor substrate after separation which is by-produced in manufacture of an SOI substrate will be described with reference to FIGS. 1A to 1D.

An SOI substrate is manufactured as follows: a semiconductor substrate (a bond substrate) is bonded to a base substrate, and a heat treatment is performed so that a semiconductor film is separated from the semiconductor substrate and formed on the base substrate. At this time, the semiconductor substrate after separation from which the semiconductor film has been separated can be reused as a semiconductor substrate used for manufacturing an SOI substrate by the following reprocessing treatment.

First, a process of by-producing a semiconductor substrate after separation will be described. FIG. 1A illustrates a semiconductor substrate divided into a semiconductor substrate 121 after separation and a semiconductor film 124 attached to a base substrate 120. After the semiconductor substrate is bonded to the base substrate 120, a heat treatment is performed so that microvoids in an embrittlement layer in the semiconductor substrate are coupled and increased in volume, and thus the semiconductor substrate is divided into the semiconductor film 124 attached to the base substrate 120 and the semiconductor substrate 121 after separation. A separation plane 129 formed on the semiconductor substrate 121 after separation and a separation plane 133 formed on the semiconductor film 124 are part of the embrittlement layer in the semiconductor substrate.

A commercially available semiconductor substrate can be used as the semiconductor substrate forming the semiconductor substrate 121 after separation and the semiconductor film 124. For example, a single crystal semiconductor substrate or a polycrystalline semiconductor substrate such as a silicon substrate can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. The peripheral portion of a commercially available silicon substrate includes a chamfer portion for preventing chipping or cracking. Note that the shape of the semiconductor substrate is not limited to a circle, and a silicon substrate processed into a rectangular shape or the like can also be used.

As shown in FIG. 1A, an insulating film may be formed over the whole surface of the semiconductor substrate. In this case, after the separation of the semiconductor substrate, the insulating film is divided into an insulating film 123 covering the semiconductor substrate 121 after separation and an insulating film 122 provided under the semiconductor film 124. The insulating film may be a single-layer or multi-layer film of a silicon oxide film, a silicon nitride film, a silicon oxynitride film, a silicon nitride oxide film, or the like. It is particularly preferable that the insulating film be made of an oxide film obtained by thermal oxidation of the semiconductor substrate.

The embrittlement layer in the semiconductor substrate is formed by implantation of $H^+$ ions using a hydrogen ion implantation separation method. Ion implantation for forming the embrittlement layer will be described in detail in Embodiment 3.

The semiconductor film 124 is formed over the base substrate with the insulating film 122 interposed therebetween. This is because the insulating film 122 is formed to cover the semiconductor substrate before the semiconductor substrate is bonded to the base substrate 120. Alternatively, an insulating film may be formed over the base substrate 120. Such a method for manufacturing an SOI substrate will be described in detail in Embodiment 3.

Figure 1B:
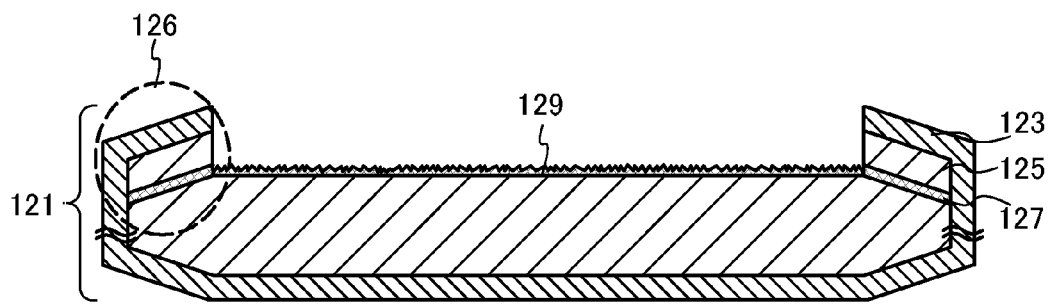

The semiconductor substrate 121 after separation is illustrated in FIG. 1B. A projecting portion 126 is formed on the periphery of the semiconductor substrate 121 after separation. The projecting portion 126 is formed on part of the semiconductor substrate, which is not bonded to the base substrate 120 due to low adhesiveness of the peripheral portion of the semiconductor substrate. This is caused by a chamfer portion on the periphery of the semiconductor substrate, or an area called edge roll off on the periphery of the semiconductor substrate which has a thickness smaller than that of the center of the substrate and is not sufficiently even.

The projecting portion 126 includes an embrittlement layer 127, a semiconductor layer 125, and the insulating film 123 that remain in order from the semiconductor substrate side. The semiconductor layer 125 and the embrittlement layer 127 contain many crystal defects caused by the above ion implantation. Crystal defects are also formed in the separation plane 129 of the semiconductor substrate 121 after separation, leading to unevenness of the separation plane 129.

Figure 1C:
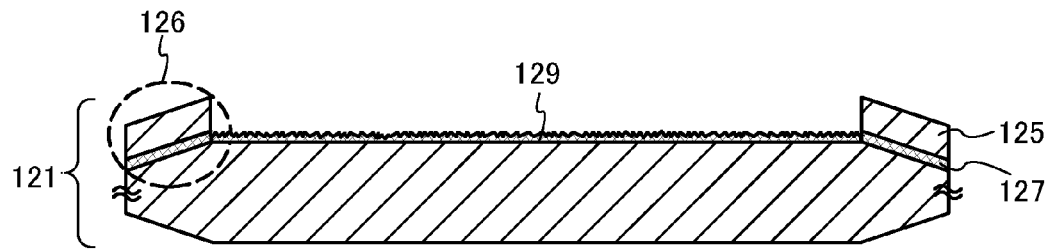

Next, as illustrated in FIG. 1C, a first etching treatment is performed so that the insulating film 123 on the semiconductor substrate 121 after separation is removed. The insulating film 123 can be removed by a wet etching treatment using a solution containing hydrofluoric acid as an etchant. As the solution containing hydrofluoric acid, it is preferable to use a mixed solution containing hydrofluoric acid, ammonium fluoride, and a surfactant (e.g., product name: LAL 500 manufactured by Stella Chemifa Corporation). This wet etching treatment is preferably performed for 120 seconds to 1200 seconds, for example, about 600 seconds. The removal of the insulating film 123 by the first etching treatment allows reducing the thickness of a removed portion of the semiconductor substrate 121 after separation in the subsequent second etching treatment, and shortening wet etching time. Since the wet etching treatment is performed in such a manner that the semiconductor substrate 121 after separation is soaked in a solution in a treatment tank, a plurality of semiconductor substrates 121 after separation can be processed at a time by batch treatment. Accordingly, the semiconductor substrate can be reprocessed effectively.

The first etching treatment for removing the insulating film 123 may be a dry etching method as long as the insulating film 123 can be removed. Alternatively, the wet etching treatment may be performed in combination with a dry etching method. Examples of the dry etching method include parallel plate RIE (reactive ion etching) and ICP (inductively coupled plasma) etching. The etching conditions (e.g., the amount of electric power applied to a coiled electrode, the amount of electric power applied to an electrode on the substrate side, and the electrode temperature on the substrate side) are adjusted as appropriate so as to process the films into a desired shape.

Figure 1D:
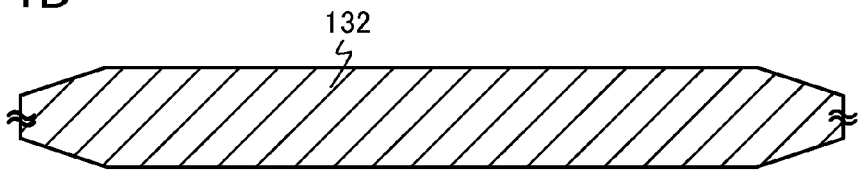

Finally, as illustrated in FIG. 1D, a second etching treatment is performed so that the semiconductor layer 125 and the embrittlement layer 127 included in the projecting portion 126 of the semiconductor substrate 121 after separation are selectively removed to form a reprocessed semiconductor substrate 132. At this time, the separation plane 129 is planarized. The semiconductor layer 125 and the embrittlement layer 127 can be removed by a wet etching treatment using as an etchant a mixed solution containing a substance functioning as an oxidizer for oxidizing a semiconductor of the semiconductor substrate, a substance dissolving the oxide of the semiconductor, and a substance functioning as a decelerator of oxidization of the semiconductor and dissolution of the oxide of the semiconductor. The second etching treatment is preferably performed for about one minute to ten minutes, for example, about two minutes to four minutes. The solution is preferably at a temperature of about 10° C. to 30° C., for example, room temperature.

It is preferable to use nitric acid as the substance functioning as an oxidizer for oxidizing the semiconductor. It is preferable to use hydrofluoric acid as the substance dissolving the oxide of the semiconductor. It is preferable to use acetic acid as the substance functioning as a decelerator of the oxidization of the semiconductor and the dissolution of the oxide of the semiconductor. Specifically, it is preferable to use as the etchant a mixed solution having a composition obtained by adjusting the volume of 70 weight % nitric acid to more than 0.01 times and less than one time as large as that of 97.7 weight % acetic acid and to more than 0.1 times and less than 100 times as large as that of 50 weight % hydrofluoric acid, and further adjusting the volume of 50 weight % hydrofluoric acid to more than 0.01 times and less than 0.3 times as large as that of 97.7 weight % acetic acid. More preferably, it is used as the etchant a mixed solution having a composition obtained by adjusting the volume of 70 weight % nitric acid to more than or equal to 0.2 times and less than or equal to 0.5 times as large as that of 97.7 weight % acetic acid and more than or equal to one time and less than or equal to 10 times as large as that of 50 weight % hydrofluoric acid, and further adjusting the volume of 50 weight % hydrofluoric acid to more than or equal to 0.1 times and less than or equal to 0.2 times as large as that of 97.7 weight % acetic acid. For example, the volume ratio between 50 weight % hydrofluoric acid, 70 weight % nitric acid, and 97.7 weight % acetic acid is preferably 1:3:10, 1:2:10, 1.5:3:10, 2:2:10, 1:10:20, or 1:1:10.

The mixed solution used as the etchant for the second etching treatment can easily penetrate into the semiconductor layer 125 and the embrittlement layer 127 included in the projecting portion 126, because many crystal defects and microvoids caused by the ion implantation are formed in the semiconductor layer 125 and the embrittlement layer 127. Accordingly, not only the surface of the semiconductor layer 125 but also the inside of the semiconductor layer 125 and the embrittlement layer 127 can be subjected to the wet etching treatment. The wet etching treatment often proceeds in such a manner that a deep hole is formed in a direction perpendicular to the plane surface of the substrate and the hole is expanded. Thus, the wet etching treatment is performed on the semiconductor layer 125 and the embrittlement layer 127 at a higher etching rate than on the other part of the semiconductor substrate 121 after separation which does not include the projecting portion 126.

That is, the semiconductor layer 125 and the embrittlement layer 127 can be selectively removed by the wet etching treatment using as an etchant a mixed solution containing a substance functioning as an oxidizer for oxidizing a semiconductor of the semiconductor substrate, a substance dissolving the oxide of the semiconductor, and a substance functioning as a decelerator of oxidization of the semiconductor and dissolution of the oxide of the semiconductor. Here, the crystal defects caused by the ion implantation allow the semiconductor layer 125 and the embrittlement layer 127 to be readily etched. Simultaneously, the separation surface 129 is also readily etched due to the crystal defects therein. However, after removing the separation surface 129, the semiconductor layer 125, and the embrittlement layer 127, a surface of the semiconductor substrate 132 containing few crystal defects, which is located thereunder, is exposed, resulting in reduction in the etching rate. As a result, the projection 126 is selectively etched. Accordingly, the semiconductor substrate 121 after separation other than the projecting portion 126 can be prevented from being reduced in thickness in the reprocessing treatment, resulting in a reduction in the thickness of a removed portion of the reprocessed semiconductor substrate 132, and an increase in the number of times of reprocessing and reusing one semiconductor substrate. In addition, in the wet etching treatment, a plurality of semiconductor substrates 121 after separation can be easily processed at a time by batch treatment; therefore, the semiconductor substrate can be reprocessed effectively. Furthermore, the second etching treatment can be performed in a relatively short time, which makes the reprocessing treatment efficient.

Note that the separation plane 129 remains after the second etching treatment in some cases. In that case, the separation plane 129 is preferably removed by a polishing treatment or the like described in Embodiment 2.

After the second etching treatment, the semiconductor substrate may be subjected to the above polishing treatment or a planarizing treatment such as a laser irradiation treatment. There is no limitation on the number of times of the polishing treatment and the laser irradiation treatment, and the polishing treatment and the laser irradiation treatment may be performed in combination. There is also no limitation on the order of the treatment steps, and the steps may be performed in an appropriate order. The light irradiation treatment may be performed with lamp light instead of laser light.

Through the above steps, the semiconductor substrate 121 after separation is reprocessed into the reprocessed semiconductor substrate 132.

As shown in this embodiment, after the insulating film is removed by the first etching treatment, the embrittlement layer and the semiconductor layer remaining on the periphery of the semiconductor substrate after separation can be selectively removed by the second etching treatment using a mixed solution containing a substance functioning as an oxidizer for oxidizing a semiconductor, a substance dissolving an oxide of a semiconductor, and a substance functioning as a decelerator of oxidization of a semiconductor and dissolution of an oxide of a semiconductor. Thus, the removed portion of the reprocessed semiconductor substrate can be reduced in thickness, and one semiconductor substrate can be reprocessed and reused more times.

Note that the structure shown in this embodiment can be used in combination with structures shown in the other embodiments as appropriate.

Embodiment 2

In this embodiment, a method for reprocessing a semiconductor substrate after separation, which is different from that in Embodiment 1, will be described with reference to FIGS. 2A to 2C.

Figure 2A:
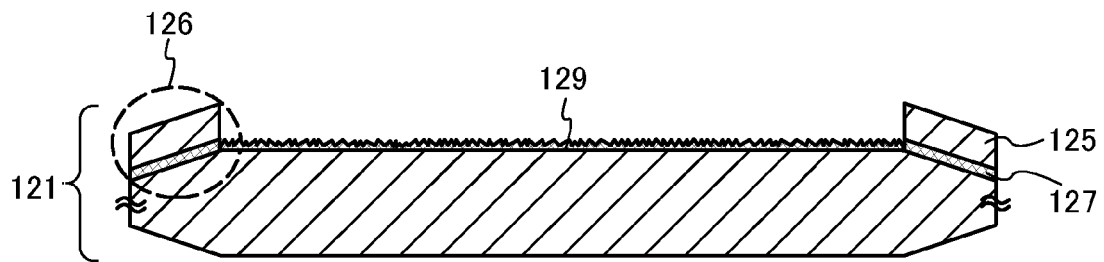
FIGS. 2A to 2C illustrate a method for reprocessing a semiconductor substrate after separation according to one embodiment of the present invention.
Figure 2B:
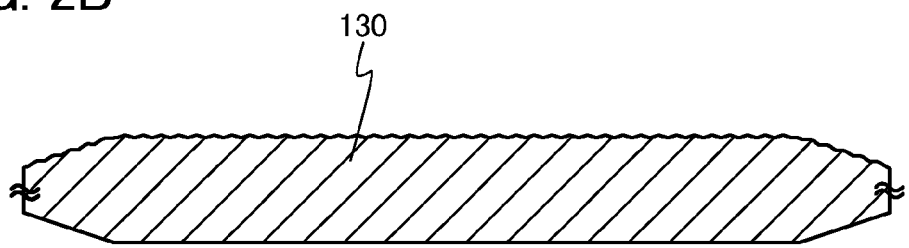
Figure 2C:
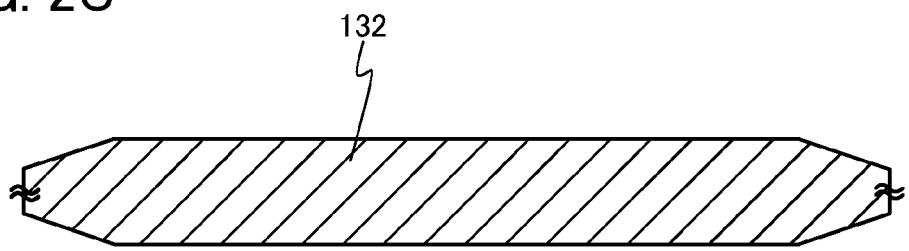

First, a first etching treatment illustrated in FIG. 2A is performed in a manner similar to that in Embodiment 1, so that a reprocessing treatment is performed up to removal of an insulating film 123 on a semiconductor substrate 121 after separation. Next, a second etching treatment is performed also in a manner similar to that in Embodiment 1. Here, in the case where a semiconductor substrate 130 after separation is not sufficiently plane as illustrated in FIG. 2B, a planarization treatment is performed on the semiconductor substrate 130 after separation as described in this embodiment, so that a reprocessed semiconductor substrate 132 is formed. In addition, also in the case where a separation plane 129 is not sufficiently removed through the second etching treatment, the planarization treatment is preferably performed to remove the remaining separation plane 129.

The planarization treatment can be performed by polishing or laser irradiation. There is no limitation on the number of times of the polishing treatment and the laser irradiation treatment, and the polishing treatment and the laser irradiation treatment may be performed in combination. There is also no limitation on the order of the treatment steps, and the steps may be performed in an appropriate order. The light irradiation treatment may be performed with lamp light instead of laser light. In this embodiment, the planarization treatment is performed by polishing as an example.

The semiconductor substrate 121 after separation is preferably polished by chemical mechanical polishing (CMP). The CMP is a method of planarizing a surface of an object to be processed by a chemical and mechanical compound effect using the surface as a reference. In general, the CMP is performed as follows: a polishing cloth is attached to a polishing stage, the polishing stage and the object to be processed are each rotated or swung while a slurry (an abrasive)

is supplied between the object to be processed and the polishing cloth, and the surface of the object to be processed is polished by chemical reaction between the slurry and the surface of the object to be processed and by action of mechanical polishing of the object to be processed with the polishing cloth.

The polishing by the CMP method may be performed once or plural times. When the polishing is performed plural times, first polishing is preferably performed with a high polishing rate followed by final polishing with a low polishing rate. At the first polishing, a polyurethane polishing cloth is preferably used, and the grain diameter of the slurry is preferably 120 nm to 180 nm, for example, approximately 150 nm. At the final polishing, a suede polishing cloth is preferably used, and the grain diameter of the slurry is preferably 45 nm to 75 nm, for example, approximately 60 nm. In this manner, polishing is performed on the semiconductor substrate 130 after separation, thereby forming the reprocessed semiconductor substrate 132 which is planarized and made to have a mirror surface with an average surface roughness of approximately 0.2 nm to 0.5 nm. In addition, by combining polishing with different polishing rates, the semiconductor substrate 130 after separation can be planarized and made to have a mirror surface in a short time.

Thus, by polishing by the CMP method after a semiconductor layer 125 and an embrittlement layer 127 are removed from the semiconductor substrate 121 after separation through the first etching treatment and the second etching treatment, the reprocessed semiconductor substrate can have a highly planar surface.

Note that the structure shown in this embodiment can be used in combination with structures shown in the other embodiments as appropriate.

Embodiment 3

In a method for manufacturing an SOI substrate of this embodiment, a semiconductor substrate which is a bond substrate is bonded to a base substrate, and an SOI substrate including a semiconductor film separated from the semiconductor substrate is manufactured. The semiconductor substrate after separation from which the semiconductor film has been separated is subjected to a reprocessing treatment and reused as a bond substrate. One of the methods for manufacturing an SOI substrate of one embodiment of the present invention will be described below with reference to FIGS. 3A to 3C, FIGS. 4A to 4C, FIGS. 5A to 5C, and FIG. 6.

First, a process of forming an embrittlement layer 104 in a semiconductor substrate 100 to prepare for bonding the semiconductor substrate 100 to a base substrate 120 is described. The following process corresponds to Process A (a bond substrate process) in FIG. 6.

Figure 3A:
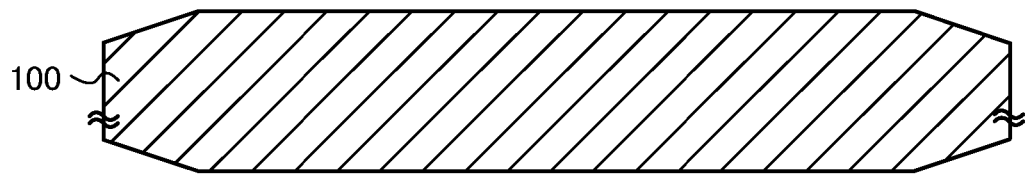
FIGS. 3A to 3C illustrate a method for manufacturing an SOI substrate according to one embodiment of the present invention.
Figure 6:
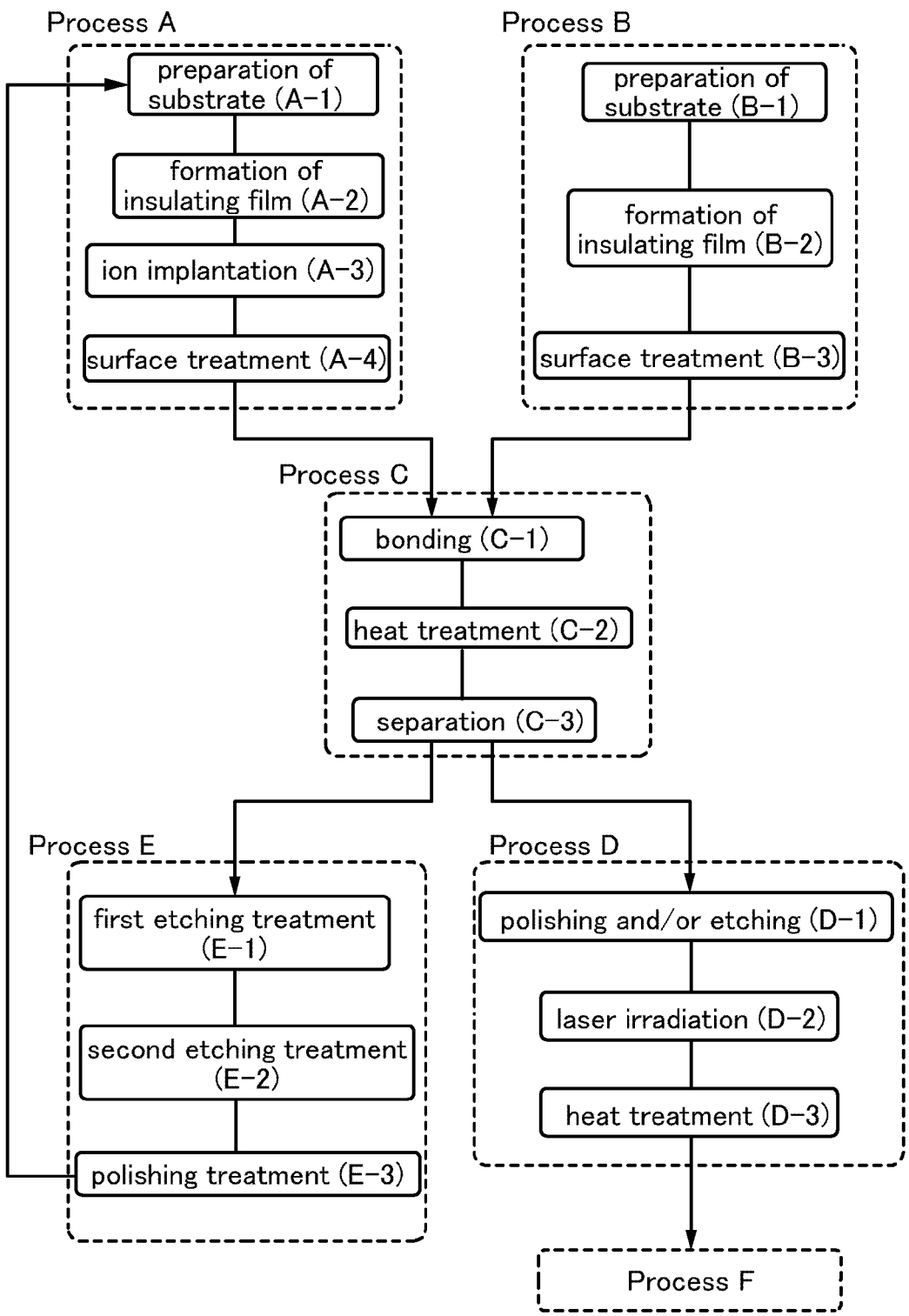
FIG. 6 illustrates a process flow of manufacturing an SOI substrate according to one embodiment of the present invention.

First, the semiconductor substrate 100 illustrated in FIG. 3A is prepared (this step corresponds to Step A-1 in FIG. 6). A commercially available semiconductor substrate can be used as the semiconductor substrate 100, and for example, a single crystal semiconductor substrate or a polycrystalline semiconductor substrate such as a silicon substrate can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. The peripheral portion of a commercially available silicon substrate includes a chamfer portion for preventing chipping or cracking as illustrated in FIG. 3A. Note that the shape of the semiconductor substrate is not limited to a circle, and a silicon substrate processed into a rectangular shape or the like can also be used. In the description below, a rectangular single crystal silicon substrate is used as the semiconductor substrate 100.

Note that the surface of the semiconductor substrate 100 is preferably cleaned as appropriate using a sulfuric acid/hydrogen peroxide mixture (SPM), an ammonium hydroxide/hydrogen peroxide mixture (APM), a hydrochloric acid/hydrogen peroxide mixture (HPM), dilute hydrofluoric acid (DHF), or the like. Further, diluted hydrofluoric acid and ozone water may be discharged alternately to clean the surface of the semiconductor substrate 100.

Figure 3B:
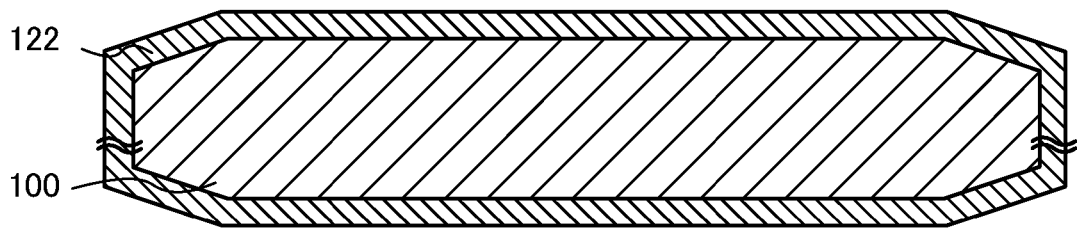

Next, as illustrated in FIG. 3B, after the surface of the semiconductor substrate 100 is cleaned, an insulating film 122 is formed on the semiconductor substrate 100 (this step corresponds to Step A-2 in FIG. 6). The insulating film 122 may be either a single insulating film or a stack layer including a plurality of insulating films. For example, in this embodiment, silicon oxide is used for the insulating film 122. As a film which forms the insulating film 122, an insulating film which contains silicon as a component, such as a silicon oxide film, a silicon nitride film, a silicon oxynitride film, or a silicon nitride oxide film, can be used.

Note that in this specification, a "silicon oxynitride film" means a film that contains more oxygen atoms than nitrogen atoms, and oxygen, nitrogen, silicon, and hydrogen at concentrations ranging from 50 atomic % to 70 atomic %, 0.5 atomic % to 15 atomic %, 25 atomic % to 35 atomic %, and 0.1 atomic % to 10 atomic %, respectively, when they are measured by RBS (Rutherford Backscattering Spectrometry) and HFS (Hydrogen Forward Scattering). Further, a "silicon nitride oxide film" means a film that contains more nitrogen atoms than oxygen atoms, and oxygen, nitrogen, silicon, and hydrogen at concentrations ranging from 5 atomic % to 30 atomic %, 20 atomic % to 55 atomic %, 25 atomic % to 35 atomic %, and 10 atomic % to 30 atomic %, respectively, when they are measured by RBS and HFS. Note that percentages of nitrogen, oxygen, silicon, and hydrogen fall within the ranges given above when the total number of atoms contained in the silicon oxynitride film or the silicon nitride oxide film is defined as 100 atomic %.

In the case of using silicon oxide for the insulating film 122, the insulating film 122 can be formed by a vapor deposition method such as a thermal CVD method, a plasma CVD method, an atmospheric pressure CVD method, or a bias ECRCVD method using a mixed gas of silane and oxygen, a mixed gas of TEOS (tetraethoxysilane) and oxygen, or the like. In that case, a surface of the insulating film 122 may be densified by an oxygen plasma treatment.

Alternatively, silicon oxide deposited by a chemical vapor deposition method using an organosilane gas may be used as the insulating film 122. As an organosilane gas, it is possible to use a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$).

Further alternatively, the insulating film 122 can be formed using an oxide film formed by oxidizing the semiconductor substrate 100. A thermal oxidation treatment for forming the oxide film may be dry oxidation or may be performed in an oxidizing atmosphere to which a halogen-containing gas is added. As the halogen-containing gas, one or plural kinds of gases selected from HCl, HF, $NF_3$, HBr, $Cl_2$, $ClF_3$, $BCl_3$, $F_2$, $Br_2$, and the like can be used. Note that the insulating film is formed to cover the semiconductor substrate 100 in FIG. 3B;

however, this embodiment is not limited to this structure. In the case where the insulating film 122 is formed on the semiconductor substrate 100 by a CVD method or the like, the insulating film 122 may be formed on only one of the plane surfaces of the semiconductor substrate 100.

For example, a heat treatment is carried out in an atmosphere containing HCl at a ratio of 0.5 volume % to 10 volume % (preferably 3 volume %) with respect to oxygen at a temperature higher than or equal to 700° C. and lower than or equal to 1100° C. For example, the heat treatment may be performed at approximately 950° C. Treatment time may be 0.1 to 6 hours, preferably, 0.5 to 1 hour. The thickness of the oxide film to be formed can be set in the range of 10 nm to 1100 nm (preferably 50 nm to 150 nm), for example, 100 nm.

This thermal oxidation treatment in the atmosphere containing a halogen allows the oxide film to contain a halogen. When the oxide film contains a halogen element at a concentration of $1\times10^{17}$ atoms/cm$^3$ to $1\times10^{21}$ atoms/cm$^3$, the halogen in the oxide film captures heavy metal that is an extrinsic impurity (for example, Fe, Cr, Ni, or Mo), thereby preventing contamination of the semiconductor film to be formed later.

Further, the insulating film 122 containing a halogen such as chlorine can serve to getter impurities (e.g., movable ions of Na) which adversely affect the semiconductor substrate 100. Specifically, by a heat treatment which is performed after the insulating film 122 is formed, impurities contained in the semiconductor substrate 100 are separated out to the insulating film 122, reacted with a halogen atom (e.g. a chlorine atom), and captured. Accordingly, the impurities captured in the insulating film 122 can be fixed and prevented from contaminating the semiconductor substrate 100.

In particular, the inclusion of a halogen such as chlorine in the insulating film 122 by a heat treatment under an atmosphere containing a halogen is effective in removing contamination of the semiconductor substrate when cleaning of the semiconductor substrate 100 is insufficient or when the semiconductor substrate 100 is repeatedly subjected to reprocessing treatments and reused.

Moreover, the halogen element contained in the oxidation treatment terminates defects on the surface of the semiconductor substrate 100; as a result, the local level density of an interface between the oxide film and the semiconductor substrate 100 can be reduced.

The halogen contained in the insulating film 122 makes distortions in the insulating film 122. As a result, moisture absorption rate in the insulating film 122 is improved and diffusion rate of moisture is increased. That is, when moisture is present on a surface of the insulating film 122, the moisture present on the surface of the insulating film 122 can be rapidly absorbed and diffused into the insulating film 122.

In the case of using silicon nitride for the insulating film 122, the insulating film 122 can be formed using a mixed gas of silane and ammonium by a vapor deposition method such as plasma CVD. In addition, in the case of using silicon nitride oxide for the insulating film 122, the insulating film 122 can be formed using a mixed gas of silane and ammonium or a mixed gas of silane and dinitrogen monoxide by a vapor deposition method such as a plasma CVD method.

For example, in the case of forming a barrier film having a single-layer structure as the insulating film 122, the insulating film 122 can be a silicon nitride film or a silicon nitride oxide film with a thickness greater than or equal to 15 nm and less than or equal to 300 nm.

In the case of forming a two-layer barrier film as the insulating film 102, the upper layer is formed using an insulating film with a high barrier property. The upper layer of the insulating film can be formed using, for example, a silicon nitride film or a silicon nitride oxide film having a thickness of 15 nm to 300 nm inclusive. These films have a high blocking effect for preventing impurity diffusion, but their internal stress is also high. Therefore, as an insulating film of a lower layer that is in contact with the semiconductor substrate 100, it is preferable to select a film that has an effect of relieving the stress of an insulating film of the upper layer. Examples of the insulating film with an effect of relieving the stress of the upper insulating film include a silicon oxide film, a silicon oxynitride film, and a thermally oxidized film formed by thermally oxidizing the semiconductor substrate 100. The thickness of the lower insulating film can be from 5 nm to 200 nm inclusive.

For example, in order for the insulating film 122 to function as a blocking film, the insulating film 122 may be formed by a combination of a silicon oxide film and a silicon nitride film, a silicon oxynitride film and a silicon nitride film, a silicon oxide film and a silicon nitride oxide film, a silicon oxynitride film and a silicon nitride oxide film, or the like.

Figure 3C:
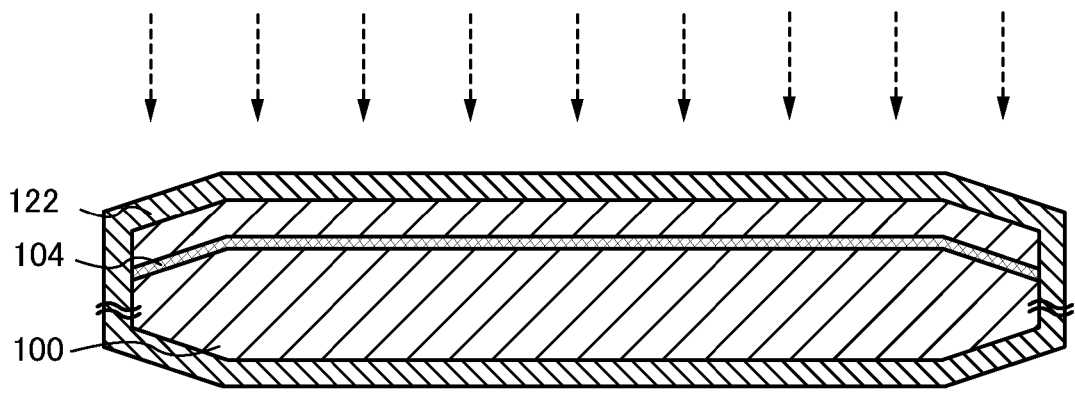

Next, as illustrated in FIG. 3C, H$^+$ ions accelerated by an electric field are implanted into the semiconductor substrate 100 through the insulating film 122 as indicated by arrows. Thus, the embrittlement layer 104 having microvoids is formed in a region at a predetermined depth from the surface of the semiconductor substrate 100 (this step corresponds to Step A-3 in FIG. 6). The depth at which the embrittlement layer 104 is formed can be adjusted by the acceleration energy of the ion beam and the incident angle of the ion beam. The acceleration energy can be adjusted by an acceleration voltage, dosage, or the like. The embrittlement layer 104 is formed in a region at the same depth or substantially the same depth as the average penetration depth of the ions. Therefore, the thickness of a semiconductor film 124 which is separated from the semiconductor substrate 100 later is determined by the depth at which the ions are added. The depth at which the embrittlement layer 104 is formed can be set in the range of, for example, greater than or equal to 100 nm and less than or equal to 500 nm, preferably greater than or equal to 50 nm and less than or equal to 200 nm; for example, the depth is preferably about 100 nm from the surface of the semiconductor substrate 100. Note that the ions are implanted after formation of the insulating film 122 in this embodiment; however, the present invention is not limited to this and the ions may be implanted before the formation of the insulating film 122.

The embrittlement layer 104 is formed with an ion implantation apparatus. The ion implantation apparatus is a mass-separation apparatus with which ion specifies having a specific mass are implanted into a processing object after mass separation of ion species in plasma.

The ion implantation apparatus is a mass-separation apparatus with which a processing object disposed in a chamber is irradiated with an ion species having a specific mass after mass separation of plural kinds of ion species generated by excitation of a source gas into plasma. Thus, when the ion implantation apparatus is used, H$^+$ ions that are generated by excitation of a hydrogen gas or PH$_3$ are subjected to mass separation, and H$^+$ ions are accelerated, with which the semiconductor substrate 100 is irradiated.

Next, the semiconductor substrate 100 over which the insulating film 122 is formed is cleaned. This cleaning step can be performed by ultrasonic cleaning with use of pure water or by two-fluid jet cleaning with use of pure water and nitrogen. The ultrasonic cleaning is preferably megahertz ultrasonic cleaning (megasonic cleaning). After the ultrasonic cleaning or the two-fluid jet cleaning, the semiconductor substrate 100 may be cleaned with ozone water. By the cleaning with ozone water, removal of organic substances and surface activation for improving the hydrophilic property of a surface of the insulating film 122 can be performed.

The surface activation of the insulating film 122 can be performed by irradiation with an atomic beam or an ion beam, an ultraviolet treatment, an ozone treatment, a plasma treatment, a plasma treatment by application of a bias voltage, or a radical treatment as well as by cleaning with ozone water (this step corresponds to Step A-4 in FIG. 6). In the case of using an atomic beam or an ion beam, an inert gas neutral atom beam or an inert gas ion beam of argon or the like can be used.

Here, an example of the ozone treatment is described. For example, the ozone treatment can be performed on a surface of an object by irradiation with ultraviolet (UV) in an atmosphere containing oxygen. The ozone treatment in which irradiation with ultraviolet is performed under an atmosphere containing oxygen is also called a UV ozone treatment, an ultraviolet ozone treatment, or the like. When irradiation with light having a wavelength of less than 200 nm and light having a wavelength of greater than or equal to 200 nm among ultraviolet is performed in an atmosphere containing oxygen, ozone can be generated and singlet oxygen can be generated by ozone. When irradiation with light having a wavelength of less than 180 nm among ultraviolet is performed, ozone can also be generated and singlet oxygen can be generated by ozone.

Examples of reactions which occur by performing irradiation with light having a wavelength of less than 200 nm and light having a wavelength of greater than or equal to 200 nm in an atmosphere containing oxygen are described.

$$O_2 + h\nu(\lambda_1 \text{ nm}) \rightarrow O(^3P) + O(^3P) \quad (1)$$

$$O(^3P) + O_2 \rightarrow O_3 \quad (2)$$

$$O_3 + h\nu(\lambda_2 \text{ nm}) \rightarrow O(^1D) + O_2 \quad (3)$$

In the reaction formula (1), by irradiation with light (hv) having a wavelength of lower than 200 nm ($\lambda_1$ nm) in an atmosphere containing oxygen ($O_2$), oxygen atoms in a ground state ($O(^3P)$) are generated. Then, in the reaction formula (2), the oxygen atom in a ground state ($O(^3P)$) and oxygen ($O_2$) react with each other; accordingly, ozone ($O_3$) is generated. Then, in the reaction formula (3), irradiation with light having a wavelength ($\lambda_2$ nm) of greater than or equal to 200 nm in an atmosphere containing generated ozone ($O_3$) is performed to generate singlet oxygen $O(^1D)$ in an excited state. In an atmosphere containing oxygen, irradiation with light having a wavelength of less than 200 nm among ultraviolet is performed to generate ozone while irradiation with light having a wavelength of greater than or equal to 200 nm among ultraviolet is performed to generate singlet oxygen by decomposing ozone. The ozone treatment described above, for example, can be performed by irradiation with light of a low-pressure mercury lamp ($\lambda_1=185$ nm, $\lambda_2=254$ nm) in an atmosphere containing oxygen.

Examples of reactions which occur by performing irradiation with light having a wavelength of less than 180 nm in an atmosphere containing oxygen are described.

$$O_2 + h\nu(\lambda_3 \text{ nm}) \rightarrow O(^1D) + O(^3P) \quad (4)$$

$$O(^3P) + O_2 \rightarrow O_3 \quad (5)$$

$$O_3 + h\nu(\lambda_3 \text{ nm}) \rightarrow O(^1D) + O_2 \quad (6)$$

In the above reaction formula (4), irradiation with light having a wavelength ($\lambda_3$ nm) of less than 180 nm in an atmosphere containing oxygen ($O_2$) is performed to generate singlet $O(^1D)$ in an excited state and an oxygen atom ($O(^3P)$) in a ground state. Next, in the reaction formula (5), an oxygen atom ($O(^3P)$) in a ground state and oxygen ($O_2$) react with each other to generate ozone ($O_3$). In the reaction formula (6), irradiation with light having a wavelength ($\lambda_3$ nm) of less than 180 nm in an atmosphere containing generated ozone ($O_3$) is performed to generate singlet oxygen in an excited state and oxygen. In an atmosphere containing oxygen, irradiation with light having a wavelength of less than 180 nm among ultraviolet is performed to generate ozone and to generate singlet oxygen by decomposing ozone or oxygen. The ozone treatment described above, for example, can be performed by irradiation with light of a Xe excimer UV lamp ($\lambda_3=172$ nm) in an atmosphere containing oxygen.

Chemical bonding of an organic substance attached to a surface of an object is cut by light having a wavelength of less than 200 nm, so that the organic substance attached to the surface of the object or the organic substance whose chemical bonding is cut can be removed by oxidative decomposition with ozone or singlet oxygen generated by ozone. By performing such an ozone treatment, a hydrophilic property and purity of the surface of the object can be increased, and strong bonding with the base substrate can be achieved.

Ozone is generated by performing irradiation with ultraviolet in an atmosphere containing oxygen. Ozone is effective in removal of the organic substance attached to the surface of the object. In addition, singlet oxygen is also effective in removal of the organic substance attached to the surface of the object as much as or more than ozone. Ozone and singlet oxygen are examples of oxygen in an active state, and collectively called active oxygen. As described with the above reaction formulae and the like, there are reactions where ozone is generated in generating singlet oxygen or singlet oxygen is generated by ozone; accordingly, such reactions including a reaction to which singlet oxygen contributes are called an ozone treatment for convenience.

Next, a process of preparing for bonding the base substrate 120 to the semiconductor substrate 100 is described. The following process corresponds to Process B in FIG. 6.

First, the base substrate 120 is prepared (this step corresponds to Step B-1 in FIG. 6). Specific examples of the base substrate 120 include a semiconductor wafer such as a silicon wafer or a germanium wafer, and a compound semiconductor wafer such as a gallium arsenide wafer or an indium phosphide wafer. It is preferable that a single crystal semiconductor wafer be used as the second semiconductor wafer 101, but a polycrystalline semiconductor wafer may be used as well. It is also possible to use a semiconductor wafer made of silicon having lattice distortion, silicon germanium in which germanium is added to silicon, or the like. Silicon having lattice distortion can be formed by being deposited over silicon germanium or silicon nitride, which has a larger lattice constant than silicon. Alternatively, a quartz substrate having high heat resistance may be used as the base substrate 120. In this embodiment, a silicon wafer is used as the base substrate 120.

An insulating film may be formed over the base substrate 120 (this step corresponds to Step B-2 in FIG. 6). For example, a silicon nitride film, a silicon nitride oxide film, an aluminum nitride film, or an aluminum nitride oxide film may be formed on the surface of the base substrate 120. Since such an insulating film is used as a bonding layer, a surface of the insulating film is preferably planarized in order to suppress defective bonding. Specifically, the insulating film is formed to have an average surface roughness (Ra) of 0.50 nm or less and a root-mean-square roughness (Rms) of 0.60 nm or less, more preferably, an average surface roughness of 0.35 nm or less and a root-mean-square roughness of 0.45 nm or less. The insulating film preferably has a thickness of 10 nm to 200 nm inclusive, more preferably, 50 nm to 100 nm inclusive.

A surface of the base substrate 120 is cleaned before the bonding. The surface of the base substrate 120 can be cleaned with chlorine acid and hydrogen peroxide water or by megahertz ultrasonic cleaning, two-fluid jet cleaning, or cleaning with ozone water. Similarly to the insulating film 122, the insulating film is preferably bonded after an surface activation treatment such as irradiation with an atomic beam or an ion beam, an ultraviolet treatment, an ozone treatment, a plasma treatment, a plasma treatment by application of a bias voltage, or a radical treatment (this step corresponds to Step B-3 in FIG. 6).

Next, described is a process in which the semiconductor substrate 100 is bonded to the base substrate 120 and then separated into the semiconductor film 124 bonded to the base substrate 120 which is to be an SOI substrate and a semiconductor substrate 121 after separation which is subjected to a reprocessing treatment and reused. The following process corresponds to Process C (a bonding process) in FIG. 6.

Figure 4A:
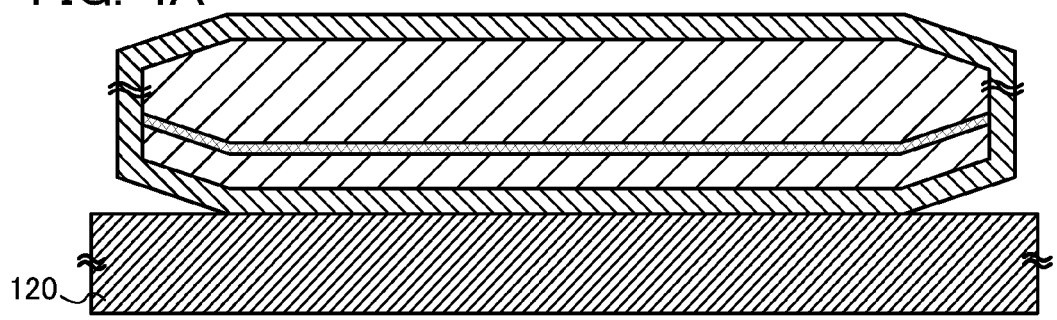
FIGS. 4A to 4C illustrate the method for manufacturing an SOI substrate according to one embodiment of the present invention.

Next, as illustrated in FIG. 4A, the semiconductor substrate 100 and the base substrate 120 are bonded to each other with the insulating film 122 interposed therebetween so that the insulating film 122 faces the base substrate 120 side (this step corresponds to Step C-1 in FIG. 6).

The bonding can be performed by applying pressure of about 0.1 N/cm$^2$ to 500 N/cm$^2$, preferably about 1 N/cm$^2$ to 20 N/cm$^2$ to a part of the end of the base substrate 120. The bonding between the insulating film 122 and the base substrate 120 starts from the portion of the base substrate 120 to which the pressure is applied and proceeds spontaneously throughout the surface, and thus one base substrate 120 and the semiconductor substrate 100 are bonded to each other.

However, as in this embodiment, in the case where the peripheral portion of the semiconductor substrate 100 includes a chamfer portion, the base substrate 120 and the semiconductor substrate 100 are not in contact with each other in the chamber portion.

When the semiconductor substrate 100 is manufactured, a CMP method or the like is used as finishing polishing. In the CMP method, a slurry (an abrasive) penetrates between the semiconductor substrate 100 and an abrasive cloth and passes between the semiconductor substrate 100 and the abrasive cloth by centrifugal force; thus, the semiconductor substrate 100 is polished. However, when a slurry penetrates a little therebetween at this time, the peripheral portion of the semiconductor substrate 100 is polished faster than the center of the semiconductor substrate 100, so that a region where the substrate has a smaller thickness and has lower planarity than the center, which is referred to as edge roll off (ERO), is formed. Also in the case where there is no chamfer portion at an end portion of the semiconductor substrate 100, due to the ERO region in the peripheral portion of the semiconductor substrate 100, the base substrate 120 and the semiconductor substrate 100 cannot be bonded to each other in the peripheral portion of the semiconductor substrate 100 in some cases.

In addition, also in the case where the peripheral portion of the semiconductor substrate 100 is damaged by a carrier or the like when the semiconductor substrate 100 is transferred or the like, the base substrate 120 and the semiconductor substrate 100 cannot be bonded to each other in the peripheral portion of the semiconductor substrate 100 in some cases.

The bonding is performed by Van der Waals force, so that the bonding is firm even at room temperature. By applying pressure to the semiconductor substrate 100 and the base substrate 120, the semiconductor substrate 100 and the base substrate 120 can be firmly bonded to each other by hydrogen bond. Note that because the above bonding can be performed at a low temperature, various substrates can be used as the base substrate 120 as described above.

In the case where a plurality of semiconductor substrates 100 are bonded to the base substrate, there are some cases in which the base substrate 120 is not in contact with surfaces of the insulating films 122 because of the difference in thickness of the semiconductor substrates 100. Therefore, it is preferable to apply pressure not to one of the semiconductor substrates 100 but to each of the semiconductor substrates 100. Even in the case where the surfaces of the insulating films 122 are a little different in height, the bonding can be performed on the entire surfaces of the insulating films 122 as long as part of the insulating film 122 is in close contact with the base substrate 120 by bending of the base substrate 120.

After the semiconductor substrate 100 is bonded to the base substrate 120, a heat treatment for increasing the bonding force at the bonding interface is preferably performed (this step corresponds to Step C-2 in FIG. 6). This heat treatment is performed at a temperature at which the embrittlement layer 104 does not crack; specifically, at a temperature of 200° C. to 450° C. inclusive. By bonding the semiconductor substrate 100 to the base substrate 120 by the heat treatment within this temperature range, the bonding between the insulating film 122 and the base substrate 120 can be strengthened. The heat treatment for increasing the bonding force at the bonding interface is preferably performed successively in an apparatus or a place where the bonding is performed. In succession to the heat treatment for increasing the bonding force at the bonding interface, another heat treatment for separating the semiconductor substrate 100 along the embrittlement layer 104 may be performed.

Note that when a particle or the like is attached to the bonding surface in bonding the semiconductor substrate 100 to the base substrate 120, the portion where a particle or the like is attached is not bonded. In order to avoid attachment of a particle to the bonding surface, the semiconductor substrate 100 and the base substrate 120 are preferably bonded in an airtight treatment chamber. At the time of bonding the semiconductor substrate 100 to the base substrate 120, the process chamber may have a pressure lower than an atmospheric pressure such as a pressure of about $5.0 \times 10^{-3}$ Pa. The atmosphere of the bonding process also may be cleaned.

Figure 4B:
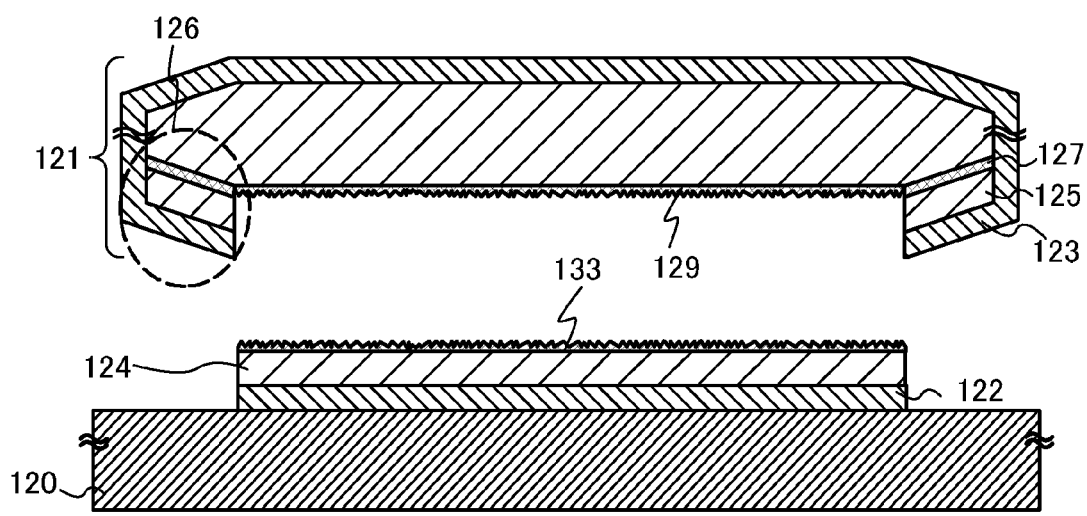

Next, as illustrated in FIG. 4B, microvoids adjacent to each other in the embrittlement layer 104 are combined by a heat treatment, and the microvoids increase in volume. As a result, through an explosive reaction in the embrittlement layer 104, the semiconductor film 124 is separated from the semiconductor substrate 100 (this step corresponds to Step C-3 in FIG. 6). Since part of the insulating film 122 is bonded to the base substrate 120, the semiconductor film 124 which is separated from the semiconductor substrate 100 is fixed to the base substrate 120. In addition, a separation plane 133 is formed on the semiconductor film 124 by separation along the embrittlement layer 104. Since the separation plane 133 is part of the embrittlement layer 104 before the separation of the semiconductor substrate 100, the separation plane 133 has a large amount of hydrogen and crystal defects formed by the separation of the semiconductor substrate 100. The heat treatment for separating the semiconductor film 124 from the semiconductor substrate 100 is performed at a temperature below the strain point of the base substrate 120. Note that the semiconductor substrate 100 from which the semiconductor film 124 is separated is called a semiconductor substrate 121 after separation.

For this heat treatment, a rapid thermal annealing (RTA) apparatus, a resistive heating furnace, or a microwave heating apparatus can be used. For the RTA apparatus, a gas rapid thermal annealing (GRTA) apparatus or a lamp rapid thermal annealing (LRTA) apparatus can be used.

In the case of using a GRTA apparatus, the heating temperature can be set in the range of 550° C. to 650° C. inclusive, and the treatment time can be set in the range of 0.5 minute to 60 minutes inclusive. In the case of using a resistance heating apparatus, the heat temperature can be set in the range of 200° C. to 650° C. inclusive and the treatment time can be set in the range of 2 hours to 4 hours inclusive.

The above-described heat treatment may be performed by dielectric heating with a high-frequency wave such as a microwave. The heat treatment using the dielectric heating can be performed by irradiating the semiconductor substrate 100 with high frequency waves in the range of 300 MHz to 3 THz which is generated at a high-frequency generator. Specifically, for example, irradiation with a microwave with a frequency of 2.45 GHz can be performed at 900 W for 14 minutes to expand microvoids and combine the microvoids adjacent to each other in the embrittlement layer, so that the semiconductor substrate 100 can be separated at last.

In addition, similarly to the separation plane 133 on the semiconductor film 124, a separation plane 129 on the semiconductor substrate 121 after separation is part of the embrittlement layer 104 before the separation of the semiconductor substrate 100; accordingly, the separation plane 129 has a large amount of hydrogen and crystal defects formed by the separation of the semiconductor substrate 100.

The peripheral portion of the semiconductor substrate 100 is not bonded to the base substrate 120 in many cases due to the chamfer portion, the ERO region, a damage formed at the time of transfer of the semiconductor substrate 100, or the like. When the semiconductor film 124 is separated from the semiconductor substrate 100 in such a state, the peripheral portion of the semiconductor substrate 100 which is not bonded to the base substrate 120 remains on the semiconductor substrate 100, and thus a projecting portion 126 is formed on the periphery of the semiconductor substrate 121 after separation. The projecting portion 126 has a remaining embrittlement layer 127, a remaining semiconductor layer 125, and a remaining insulating film 123. The semiconductor film 124 which is smaller than the semiconductor substrate 100 is bonded to the base substrate 120.

Note that in Embodiment 1 or 2, the semiconductor substrate 121 after separation may be formed by following the steps up to Step C described in this embodiment.

Next, described is a process of removing the separation plane 133 and planarizing the surface of the semiconductor film 124 which is bonded to the base substrate 120 to recover crystallinity. The following process corresponds to Step D (a finishing process of an SOI substrate) in FIG. 6.

Figure 4C:
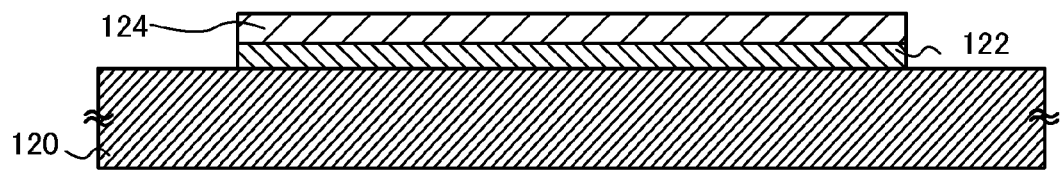

The separation plane 133 on the semiconductor film 124 which is adhered to the base substrate 120 has a crystal defect and the planarity is damaged due to formation of the embrittlement layer 104 and separation of the semiconductor substrate 100 along the embrittlement layer 104. Therefore, as illustrated in FIG. 4C, the separation plane 133 may be removed by polishing and a surface of the semiconductor film 124 may be planarized (this step corresponds to Step D-1 in FIG. 6). Although not necessarily essential, the planarization makes it possible to improve characteristics of the interface between the semiconductor film and a gate insulating film that is to be formed later. Specifically, polishing can be performed by a chemical mechanical polishing method (a CMP method), a liquid jet polishing method, or the like. When the separation plane 133 is removed, the semiconductor film 124 is polished to be a thin film in some cases.

Alternatively, the separation plane 133 may be removed by etching so that the semiconductor film 124 is planarized. The etching may be performed using a dry etching method, for example, reactive ion etching (RIE), inductively coupled plasma (ICP) etching, electron cyclotron resonance (ECR) etching, parallel-plate (capacitively coupled type) etching, magnetron plasma etching, dual-frequency plasma etching, or helicon wave plasma etching. Note that both the above polishing and etching may be employed so that the separation plane 133 is removed and the surface of the semiconductor film 124 is planarized.

Furthermore, by the polishing and etching, in addition to the planarization of a surface of the semiconductor film 124, the semiconductor film 124 can be made to such a thin film that is suitable for a semiconductor element which is fabricated later.

Laser irradiation may be performed on the separation plane 133 and the semiconductor film 124 in order to reduce the crystal defects and improve the planarity (this step corresponds to Step D-2 in FIG. 6).

In the case where the separation plane 133 is removed and the surface of the semiconductor film 124 is planarized by dry etching before the laser irradiation, damages such as crystal defects might occur at the surface of the semiconductor film 124 due to the dry etching. However, the laser irradiation can also repair the damages caused by the dry etching.

Since an increase in the temperature of the base substrate 120 can be suppressed in this laser irradiation step, a substrate having low heat resistance can be used as the base substrate 120. It is preferable that the separation plane 133 be completely melted and the semiconductor film 124 be partly melted by the laser irradiation. This is because when the semiconductor film 124 is completely melted, the recrystallization of the semiconductor film 124 is accompanied with disordered nucleation of the semiconductor film 124 in a liquid phase and crystallinity of the semiconductor film 124 is lowered. By partly melting the semiconductor film 124, so-called longitudinal growth in which crystal growth proceeds from an unmelted solid portion occurs in the semiconductor film 124. Due to the recrystallization by the longitudinal growth, crystal defects of the semiconductor film 124 are reduced and crystallinity thereof is recovered. The state in which the semiconductor film 124 is completely melted means that the semiconductor film 124 is melted to be in a liquid state to the interface with the insulating film 122. On the other hand, the state where the semiconductor film 124 is partly melted means that an upper part thereof is melted to be in a liquid phase and a lower part thereof is in a solid phase.

After the laser irradiation, the surface of the semiconductor film 124 may be etched. In the case where the surface of the semiconductor film 124 is etched after the laser irradiation, the separation plane 133 on the semiconductor film 124 is not necessarily etched before the laser irradiation. Moreover, in the case where the separation plane 133 on the semiconductor film 124 is etched before the laser irradiation, the surface of the semiconductor film 124 is not necessarily etched after the laser irradiation. Alternatively, the etching may be performed both before and after the laser irradiation.

By the above-described etching, the surface of the semiconductor film 124 can be planarized, and the semiconductor film 124 can be reduced in thickness so as to be suitable for the semiconductor element that is formed later.

After the laser irradiation, the semiconductor film 124 is preferably subjected to a heat treatment (this step corresponds to Step D-3 in FIG. 6). By this heat treatment, the defects of the semiconductor film 124 which are not repaired by the laser irradiation can be eliminated and distortion of the semiconductor film 124 can be alleviated. For this heat treatment, a rapid thermal annealing (RTA) apparatus, a resistive heating furnace, or a microwave heating apparatus can be used. For the RTA apparatus, a gas rapid thermal annealing (GRTA) apparatus or a lamp rapid thermal annealing (LRTA) apparatus can be used. The thus manufactured SOI substrate is illustrated in FIG. 4C.

Since a silicon wafer with high heat resistance is used as the semiconductor substrate 100 and the base substrate 120 in this embodiment, a heat treatment can be performed at 1000° C. or higher (typically, 100° C. to 1300° C.). In the ion implantation process for forming the embrittlement layer, the semiconductor layer on the semiconductor substrate 100 is damaged by the implanted ions. Such damage to the single crystal semiconductor layer caused in the ion implantation process can be recovered by the heat treatment for increasing the bonding strength between the semiconductor substrate 100 and the base substrate 120. Furthermore, a high-temperature heat treatment performed on the single crystal semiconductor layer on the base substrate 120 improves the crystallinity and planarity of the surface.

An example of manufacturing a semiconductor device by using the thus manufactured SOI substrate will be described with reference to FIG. 7. Note that the following process corresponds to Process F (a device process) in FIG. 6.

Figure 7:
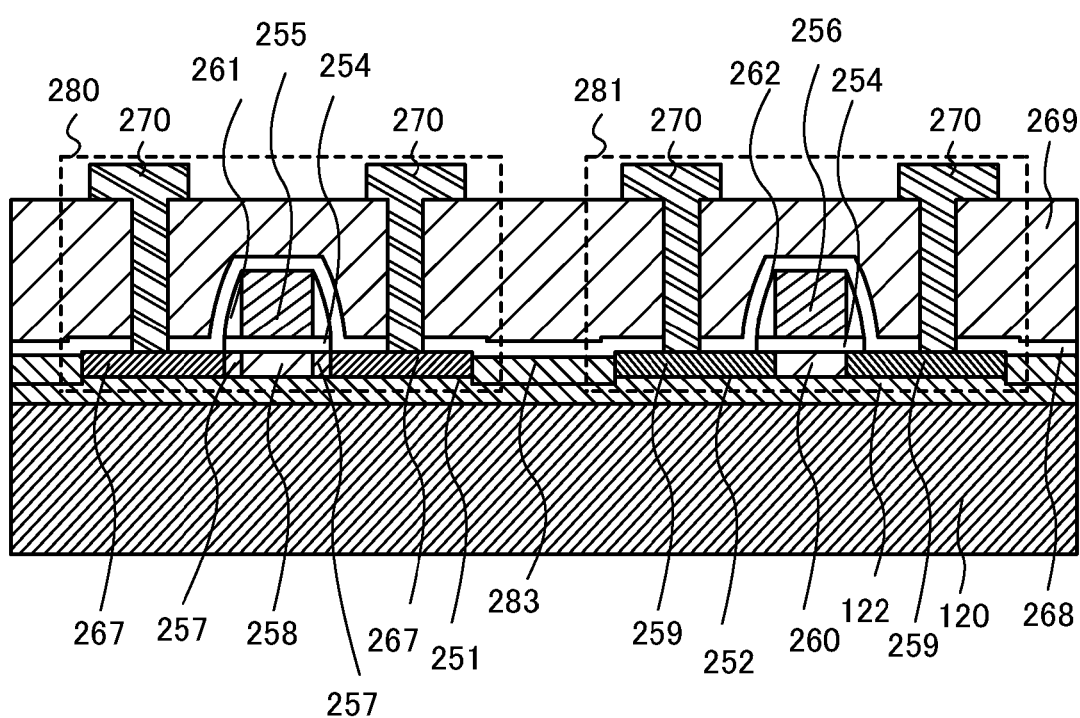
FIG. 7 illustrates a semiconductor device using an SOI substrate according to one embodiment of the present invention.

FIG. 7 illustrates an example of a semiconductor device including a transistor 280 which is an n-channel thin film transistor, and a transistor 281 which is a p-channel thin film transistor. A variety of semiconductor devices can be manufactured by combining a plurality of thin film transistors (TFTs).

As an SOI substrate, the SOI substrate manufactured by the method shown in this embodiment can be used. The transistors 280 and 281 are formed over the base substrate 120 with insulating film 122 interposed therebetween.

A method for manufacturing the semiconductor device illustrated in FIG. 7 will be described below.

As described above in this embodiment, the SOI substrate including a semiconductor film over the base substrate 120 with the insulating film 122 interposed therebetween is manufactured.

The semiconductor film and the insulating film 122 are partly etched to form an element separation layer 283, so that the semiconductor film is separated into each element with the element separation layer 283 and element regions 251 and 252 are formed as illustrated in FIG. 7. The element region 251 is included in an n-channel TFT, and the element region 252 is included in a p-channel TFT. A silicon oxide film can be used for the element separation layer 283, for example.

An insulating film 254 is formed over the element regions 251 and 252. Then, a gate electrode 255 is formed over the element region 251 with the insulating film 254 interposed therebetween, and a gate electrode 256 is formed over the element region 252 with the insulating film 254 interposed therebetween.

Before the semiconductor film is etched, an impurity element which serves as an acceptor, such as boron, aluminum, or gallium, or an impurity element which serves as a donor, such as phosphorus or arsenic, is preferably added to the semiconductor film in the SOI substrate in order to control the threshold voltage of the TFTs. For example, an impurity element which serves as an acceptor is added to a region where an n-channel TFT is to be formed, and an impurity element which serves as a donor is added to a region where a p-channel TFT is to be formed.

Next, n-type low-concentration impurity regions 257 are formed in the element region 251, and p-type high-concentration impurity regions 259 are formed in the element region 252. Specifically, first, the n-type low-concentration impurity regions 257 are formed in the element region 251. For this purpose, the element region 252 where the p-channel TFT is formed is covered with a resist mask, and an impurity element is added to the element region 251. As the impurity element, phosphorus or arsenic may be added. When an impurity element is added by an ion doping method or an ion implantation method, the gate electrode 255 serves as a mask, and the n-type low-concentration impurity regions 257 are formed in the element region 251 in a self-aligned manner. A region of the element region 251 which overlaps with the gate electrode 255 serves as a channel formation region 258.

After the mask which covers the element region 252 is removed, the element region 251 where the n-channel TFT is formed is covered with a resist mask. Next, an impurity element is added to the element region 252 by an ion doping method or an ion implantation method. As the impurity element, boron, aluminum, gallium, or the like can be added. At the step of adding an impurity element, the gate electrode 256 serves as a mask and the p-type high-concentration impurity regions 259 are formed in the element region 252 in a self-aligned manner. The high-concentration impurity regions 259 serve as a source region and a drain region. A region of the element region 252 which overlaps with the gate electrode 256 serves as a channel formation region 260. Described here is the method in which the p-type high-concentration impurity regions 259 are formed after the n-type low-concentration impurity regions 257 are formed; however, the p-type high-concentration impurity regions 259 can be formed first.

After the resist which covers the element region 251 is removed, an insulating film having a single-layer structure or a stacked-layer structure of a nitrogen compound such as silicon nitride or an oxide such as silicon oxide is formed by a plasma CVD method or the like. This insulating film is anisotropically etched in a perpendicular direction, whereby sidewall insulating films 261 and 262 are formed in contact with side surfaces of the gate electrodes 255 and 256, respectively. By this anisotropic etching, the insulating film 254 is also etched.

Next, the element region 252 is covered with a resist. In order to form high-concentration impurity regions serving as a source region and a drain region in the element region 251, an impurity element is added to the element region 251 at high dose by an ion implantation method or an ion doping method. The gate electrode 255 and the sidewall insulating film 261 serve as masks, and n-type high-concentration impurity regions 267 are formed. Next, a heat treatment for activating the impurity elements is performed.

After the heat treatment for activation, an insulating film 268 containing hydrogen is formed. After the insulating film 268 is formed, a heat treatment is performed at a temperature of 350° C. to 450° C. inclusive, hydrogen contained in the insulating film 268 is diffused into the element regions 251 and 252. The insulating film 268 can be formed by deposition of silicon nitride or silicon nitride oxide by a plasma CVD method at a process temperature of 350° C. or lower. The supply of hydrogen to the element regions 251 and 252 makes it possible to efficiently compensate defects which are to be trapping centers in the element regions 251 and 252 and at an interface with the insulating film 254.

After that, an interlayer insulating film 269 is formed. The interlayer insulating film 269 can be formed using a film having a single-layer structure or a stacked-layer structure of an insulating film made of an inorganic material, such as a silicon oxide film or a borophosphosilicate glass (BPSG) film, and an organic resin film made of polyimide, acrylic, or the like. After contact holes are formed in the interlayer insulating film 269, wirings 270 are formed. The wirings 270 can be formed with a conductive film with a three-layer structure in which a low-resistance metal film such as an aluminum film or an aluminum-alloy film is sandwiched between barrier metal films. The barrier metal films can be formed using metal films which contain molybdenum, chromium, titanium, and/or the like.

Through the steps described above, a semiconductor device having the n-channel TFT and the p-channel TFT can be manufactured. In the manufacturing process of an SOI substrate used for a semiconductor device in this embodiment, a semiconductor substrate after separation is subjected to a reprocessing treatment, whereby a plurality of semiconductor films are formed using one semiconductor substrate; therefore, a reduction in manufacturing cost and improvement in productivity can be achieved.

Although a semiconductor device and a method for manufacturing the semiconductor device is described with reference to FIG. 7, a high value-added semiconductor device can be manufactured by forming a variety of semiconductor elements such as a capacitor and a resistor together with the TFTs.

The SOI substrate described in this embodiment can be used in manufacturing any kind of semiconductor devices including microprocessors, integrated circuits such as image processing circuits, RF tags for transmitting and receiving data to and from an interrogator without contact, semiconductor display devices, and the like. The semiconductor display device includes in its category, a liquid crystal display device, a light-emitting device provided with a light-emitting element typified by an organic light-emitting diode (an OLED) in each pixel, a digital micromirror device (a DMD), a plasma display panel (a PDP), a field emission display (an FED), and the like, and also includes another semiconductor display device having a circuit element using a semiconductor film in a driver circuit.

Next, a process of performing the reprocessing treatment on the semiconductor substrate 121 after separation to repeatedly use the semiconductor substrate 121 after separation as a reprocessed semiconductor substrate will be described. The following process corresponds to Process E (a bond substrate reprocessing treatment process) in FIG. 6.

Figure 5A:
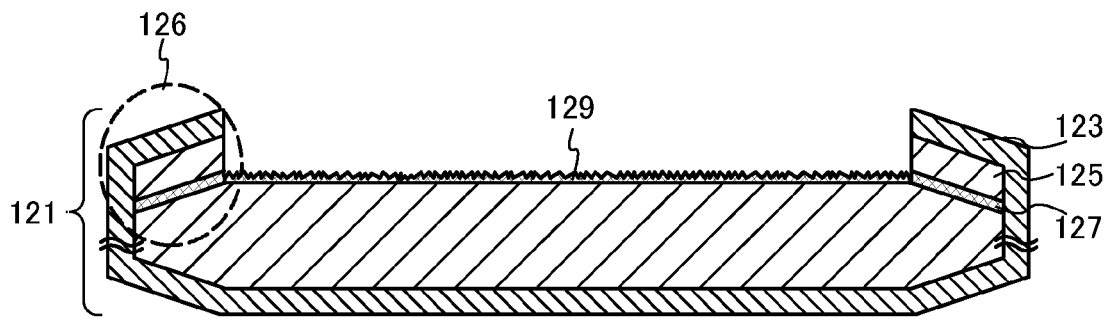
FIGS. 5A to 5C illustrate the method for manufacturing an SOI substrate according to one embodiment of the present invention.

First, the semiconductor substrate 121 after separation illustrated in FIG. 5A is taken out. The projecting portion 126 is formed on the periphery of the semiconductor substrate 121 after separation. The projecting portion 126 includes the embrittlement layer 127, the semiconductor layer 125, and the insulating film 123 that remain in order from the semiconductor substrate side. The semiconductor layer 125 and the embrittlement layer 127 contain many crystal defects caused by the above ion implantation. Crystal defects are also formed in the separation plane 129 of the semiconductor substrate 121 after separation, leading to unevenness of the separation plane 129.

Figure 5B:
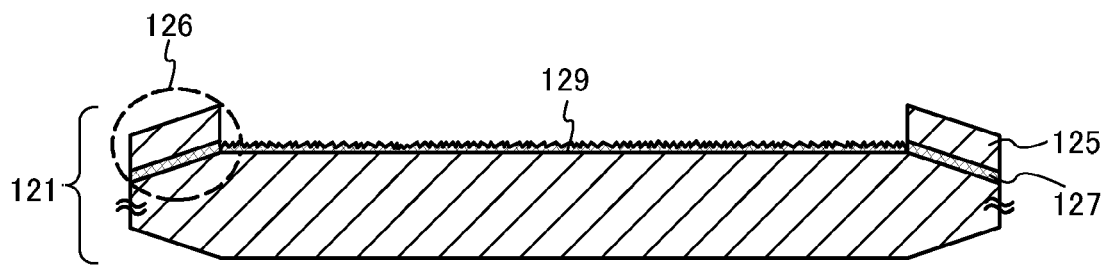

Next, as illustrated in FIG. 5B, a first etching treatment is performed so that the insulating film 123 on the semiconductor substrate 121 after separation is removed (this step corresponds to Step E-1 in FIG. 6). In this embodiment, the first etching treatment is performed by wet etching as an example, but dry etching may also be performed as long as the insulating film 123 can be removed. The insulating film 123 can be removed by a wet etching treatment using a solution containing hydrofluoric acid as an etchant. As the solution containing hydrofluoric acid, it is preferable to use a mixed solution containing hydrofluoric acid, ammonium fluoride, and a surfactant (e.g., product name: LAL 500 manufactured by Stella Chemifa Corporation). This first etching treatment is preferably performed for 120 seconds to 1200 seconds, for example, about 600 seconds. Further, the wet etching is performed in such a manner that the semiconductor substrate 121 after separation is soaked in a solution in a treatment tank; therefore, a plurality of the semiconductor substrates 121 after separation can be processed collectively. The removal of the insulating film 123 by wet etching allows reducing the thickness of a removed portion of the semiconductor substrate 121 after separation in the subsequent second etching treatment, and shortening wet etching time. In the wet etching treatment, a plurality of semiconductor substrates 121 after separation can be easily processed at a time by batch treatment; therefore, the semiconductor substrate can be reprocessed effectively.

Figure 5C:
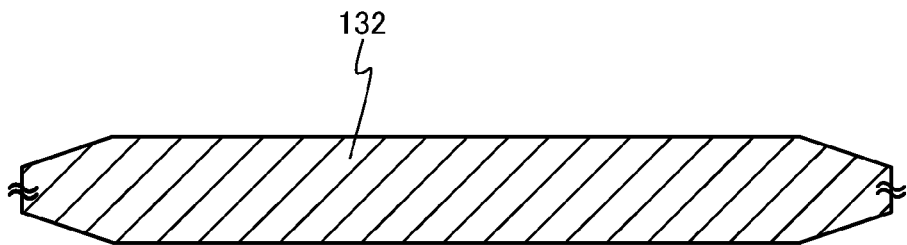

Then, as illustrated in FIG. 5C, a second etching treatment is performed so that the semiconductor layer 125 and the embrittlement layer 127 included in the projecting portion 126 of the semiconductor substrate 121 after separation are selectively removed to form a reprocessed semiconductor substrate 132 (this step corresponds to Step E-2 in FIG. 6). At this time, the separation plane 129 is also removed. The semiconductor layer 125 and the embrittlement layer 127 can be removed by a wet etching treatment using as an etchant a mixed solution containing a substance functioning as an oxidizer for oxidizing a semiconductor of the semiconductor substrate, a substance dissolving the oxide of the semiconductor, and a substance functioning as a decelerator of oxidization of the semiconductor and dissolution of the oxide of the semiconductor. This wet etching treatment is preferably performed for about one minute to ten minutes, for example, about two minutes to four minutes. The solution is preferably at a temperature of about 10° C. to 30° C., for example, room temperature.

It is preferable to use nitric acid as the substance functioning as an oxidizer for oxidizing a semiconductor. It is preferable to use hydrofluoric acid as the substance dissolving an oxide of a semiconductor. It is preferable to use acetic acid as the substance functioning as a decelerator of oxidization of a semiconductor and dissolution of an oxide of a semiconductor. Specifically, it is preferable to use as the etchant a mixed solution having a composition obtained by adjusting the volume of 70 weight % nitric acid to more than 0.01 times and less than one time as large as that of 97.7 weight % acetic acid and to more than 0.1 times and less than 100 times as large as that of 50 weight % hydrofluoric acid, and the volume of 50 weight % hydrofluoric acid to more than 0.01 times and less than 0.3 times as large as that of 97.7 weight % acetic acid. More preferably, it is preferable to use as the etchant a mixed solution having a composition obtained by adjusting the volume of 70 weight % nitric acid to more than or equal to 0.2 times and less than or equal to 0.5 times as large as that of 97.7 weight % acetic acid and more than or equal to one time and less than or equal to 10 times as large as that of 50 weight % hydrofluoric acid, and the volume of 50 weight % hydrofluoric acid to more than or equal to 0.1 times and less than or equal to 0.2 times as large as that of 97.7 weight % acetic acid. For example, the volume ratio between 50 weight % hydrofluoric acid, 70 weight % nitric acid, and 97.7 weight % acetic acid is preferably 1:3:10, 1:2:10, 1.5:3:10, 2:2:10, 1:10:20, or 1:1:10. The concentration of the substances used for an etchant is, for example, as follows: hydrofluoric acid has a concentration of 50 weight %, nitric acid has a concentration of 70 weight %, and acetic acid has a concentration of 97.7 weight %.

The mixed solution used as the etchant for the second etching treatment can easily penetrate into the semiconductor layer 125 and the embrittlement layer 127 included in the projecting portion 126, because many crystal defects and microvoids caused by the ion implantation are formed in the semiconductor layer 125 and the embrittlement layer 127. Accordingly, not only the surface of the semiconductor layer 125 but also the inside of the semiconductor layer 125 and the embrittlement layer 127 can be subjected to the wet etching treatment. The wet etching often proceeds in such a manner that a deep hole is formed in a direction perpendicular to the plane surface of the substrate and the hole is expanded. Thus, the wet etching treatment is performed on the semiconductor layer 125 and the embrittlement layer 127 at a higher etching rate than on the other part of the semiconductor substrate 121 after separation which does not include the projecting portion 126.

That is, the semiconductor layer 125 and the embrittlement layer 127 can be selectively removed by the wet etching treatment using as an etchant a mixed solution containing a substance functioning as an oxidizer for oxidizing a semiconductor of the semiconductor substrate, a substance dissolving the oxide of the semiconductor, and a substance functioning as a decelerator of oxidization of the semiconductor and dissolution of the oxide of the semiconductor. Here, the crystal defects caused by the ion implantation allow the semiconductor layer 125 and the embrittlement layer 127 to be readily etched. Simultaneously, the separation surface 129 is also readily etched due to the crystal defects therein. However, after removing the separation surface 129, the semiconductor layer 125, and the embrittlement layer 127, a surface the semiconductor layer containing few crystal defects which is located thereunder is exposed, resulting in reduction in the etching rate. As a result, the projection 126 is selectively etched. Accordingly, the semiconductor substrate 121 after separation other than the projecting portion 126 can be prevented from being reduced in thickness in the reprocessing treatment, resulting in a reduction in the thickness of a removed portion of the reprocessed semiconductor substrate 132, and an increase in the number of times of reprocessing and reusing one semiconductor substrate. In addition, in the wet etching treatment, a plurality of semiconductor substrates 121 after separation can be easily processed at a time by batch treatment; therefore, the semiconductor substrate can be reprocessed effectively. Furthermore, the second etching treatment can be performed in a relatively short time, which makes the reprocessing treatment efficient.

In addition, in the wet etching treatment, a plurality of semiconductor substrates 121 after separation can be easily processed at the same time by batch treatment; therefore, the semiconductor substrate can be reprocessed effectively. Furthermore, the second etching treatment can be performed in a relatively short time, which makes the reprocessing treatment efficient.

Here, in the case where a semiconductor substrate after separation is not sufficiently plane, the semiconductor substrate after separation can be further polished to improve planarity of a reprocessed semiconductor substrate 132 (this step corresponds to Step E-3 in FIG. 6). In addition, also in the case where a separation plane 129 is not sufficiently removed through the second etching treatment, the polishing is preferably performed to remove the remaining separation plane 129.

The semiconductor substrate 121 after separation is preferably polished by chemical mechanical polishing (CMP). The CMP is a method of planarizing a surface of an object to be processed by a chemical and mechanical compound effect using the surface as a reference. In general, the CMP is performed as follows: a polishing cloth is attached to a polishing stage, the polishing stage and the object to be processed are each rotated or swung while a slurry (an abrasive) is supplied between the object to be processed and the polishing cloth, and the surface of the object to be processed is polished by chemical reaction between the slurry and the surface of the object to be processed and by action of mechanical polishing of the object to be processed with the polishing cloth.

The polishing by the CMP method may be performed once or plural times. When the polishing is performed plural times, first polishing is preferably performed with a high polishing rate followed by final polishing with a low polishing rate. At the first polishing, a polyurethane polishing cloth is preferably used, and the grain diameter of the slurry is preferably 120 nm to 180 nm, for example, approximately 150 nm. At the final polishing, a suede polishing cloth is preferably used, and the grain diameter of the slurry is preferably 45 nm to 75 nm, for example, approximately 60 nm. In this manner, polishing is performed on the semiconductor substrate after separation, thereby forming the reprocessed semiconductor substrate 132 which is planarized and made to have a mirror surface with an average surface roughness of approximately 0.2 nm to 0.5 nm. In addition, by combining polishing with different polishing rates, the semiconductor substrate after separation can be planarized and made to have a mirror surface in a short time.

Thus, by polishing by the CMP method after the semiconductor layer 125 and the embrittlement layer 127 are removed from the semiconductor substrate 121 after separation through the first etching treatment and the second etching treatment, the reprocessed semiconductor substrate 132 can have a highly planar surface.

Through the above steps, the semiconductor substrate after separation is reprocessed into the reprocessed semiconductor substrate 132. The obtained reprocessed semiconductor substrate 132 is reused as the semiconductor substrate 100 in Process A.

As described in this embodiment, by repeatedly using a semiconductor substrate by a reprocessing treatment of the semiconductor substrate, manufacturing cost of an SOI substrate can be reduced. In particular, after the insulating film is removed by the first etching treatment, the embrittlement layer and the semiconductor layer remaining on the periphery of the semiconductor substrate after separation can be selectively removed by the second etching treatment using a mixed solution containing a substance functioning as an oxidizer for oxidizing a semiconductor of the semiconductor substrate, a substance dissolving the oxide of the semiconductor, and a substance functioning as a decelerator of oxidization of the semiconductor and dissolution of the oxide of the semiconductor. Thus, the removed portion of the reprocessed semiconductor substrate can be reduced in thickness, and one semiconductor substrate can be reprocessed and reused more times.

Note that the structure shown in this embodiment can be used in combination with structures shown in the other embodiments as appropriate.

This application is based on Japanese Patent Application serial no. 2009-149412 filed with Japan Patent Office on Jun. 24, 2009, the entire contents of which are hereby incorporated by reference.

REFERENCE NUMERALS

100: semiconductor substrate, 104: embrittlement layer, 120: base substrate, 121: semiconductor substrate after separation, 122: insulating film, 123: insulating film, 124: semiconductor film, 125: semiconductor layer, 126: projecting portion, 127: embrittlement layer, 129: separation plane, 130: semiconductor substrate after separation, 132: reprocessed semiconductor substrate, 133: separation plane, 251: element region, 252: element region, 254: insulating film, 255: gate electrode, 256: gate electrode, 257: low-concentration impurity region, 258: channel formation region, 259: high-concentration impurity region, 260: channel formation region, 261: sidewall insulating film, 262: sidewall insulating film, 267: high-concentration impurity region, 268: insulating film, 269: interlayer insulating film, 270: wiring, 280: transistor, 281: transistor, 283: element separation layer

The invention claimed is:

1. A method for reprocessing a semiconductor substrate comprising the steps of:
  forming an embrittlement layer by implanting an H$^+$ ion into a semiconductor substrate by a hydrogen ion implantation separation method, wherein an insulating film is provided on the periphery of the semiconductor substrate;
  bonding the semiconductor substrate to a base substrate with the insulating film interposed therebetween;
  separating a semiconductor film from the semiconductor substrate, wherein the semiconductor substrate after the separation comprises:
    a part of the embrittlement layer; and
    a semiconductor layer on the embrittlement layer,
  removing the insulating film by a first etching treatment; and
  exposing a surface of the semiconductor substrate by removing both the embrittlement layer and the semiconductor layer in a second etching treatment using a mixed solution comprising hydrofluoric acid, nitric acid, and acetic acid.

2. The method for reprocessing a semiconductor substrate according to claim 1,
  wherein the mixed solution has a composition obtained by adjusting a volume of 70 wt % nitric acid to more than or equal to 0.2 times and less than or equal to 0.5 times as large as a volume of 97.7 wt % acetic acid and to more than or equal to one time and less than or equal to 10 times as large as a volume of 50 wt % hydrofluoric acid and further adjusting the volume of 50 wt % hydrofluoric acid to more than or equal to 0.1 times and less than or equal to 0.2 times as large as the volume of 97.7 wt % acetic acid.

3. The method for reprocessing a semiconductor substrate according to claim 1,
  wherein the second etching treatment is performed so that the mixed solution penetrates to the semiconductor layer and the embrittlement layer.

4. The method for reprocessing a semiconductor substrate according to claim 1,
  wherein a surface of the semiconductor substrate is polished after the second etching treatment.

5. The method for reprocessing a semiconductor substrate according to claim 1,
  wherein the first etching treatment is performed using a solution containing hydrofluoric acid, ammonium fluoride, and a surfactant.

6. The method for reprocessing a semiconductor substrate according to claim 1,
  wherein the volume ratio between hydrofluoric acid, nitric acid, and acetic acid is 1:3:10.

7. The method for reprocessing a semiconductor substrate according to claim 1,
  wherein the volume ratio between hydrofluoric acid, nitric acid, and acetic acid is 1.5:3:10.

8. The method for reprocessing a semiconductor substrate according to claim 1,
  wherein the volume ratio between hydrofluoric acid, nitric acid, and acetic acid is 2:2:10.

9. The method for reprocessing a semiconductor substrate according to claim 1,
  wherein the volume ratio between hydrofluoric acid, nitric acid, and acetic acid is 1:10:20.

10. The method for reprocessing a semiconductor substrate according to claim 1,
  wherein the volume ratio between hydrofluoric acid, nitric acid, and acetic acid is 1:1:10.

11. A method for manufacturing a substrate comprising the steps of:
  forming an insulating film on a semiconductor substrate;
  forming an embrittlement layer by implanting an H$^+$ ion from a surface of the semiconductor substrate by a hydrogen ion implantation separation method;
  bonding the semiconductor substrate to a base substrate with the insulating film interposed therebetween;
  separating a semiconductor film from the semiconductor substrate, wherein the semiconductor substrate after the separation comprises:
    a part of the embrittlement layer; and
    a semiconductor layer on the embrittlement layer,
  removing the insulating film by a first etching treatment;
  exposing a surface of the semiconductor substrate by removing both the part of the embrittlement layer and the semiconductor layer in a second etching treatment using a mixed solution comprising hydrofluoric acid, nitric acid, and acetic acid; and
  polishing the semiconductor substrate after the separation.

12. A method for manufacturing a substrate according to claim 11,
  wherein the mixed solution has a composition obtained by adjusting a volume of 70 wt % nitric acid to more than or equal to 0.2 times and less than or equal to 0.5 times as large as a volume of 97.7 wt % acetic acid and to more than or equal to one time and less than or equal to 10 times as large as a volume of 50 wt % hydrofluoric acid and further adjusting the volume of 50 wt % hydrofluoric acid to more than or equal to 0.1 times and less than or equal to 0.2 times as large as the volume of 97.7 wt % acetic acid.

13. A method for manufacturing a substrate according to claim 11,
  wherein the second etching treatment is performed so that the mixed solution penetrates to the semiconductor layer and the embrittlement layer.

14. The method for manufacturing a substrate according to claim 11,
  wherein the first etching treatment is performed using a solution containing hydrofluoric acid, ammonium fluoride, and a surfactant.

15. The method for manufacturing a substrate according to claim 11,
  wherein the volume ratio between hydrofluoric acid, nitric acid, and acetic acid is 1:3:10.

16. The method for manufacturing a substrate according to claim 11,
  wherein the volume ratio between hydrofluoric acid, nitric acid, and acetic acid is 1.5:3:10.

17. A method for manufacturing a substrate according to claim 11, wherein the volume ratio between hydrofluoric acid, nitric acid, and acetic acid is 2:2:10.

18. The method for manufacturing a substrate according to claim 11,
wherein the volume ratio between hydrofluoric acid, nitric acid, and acetic acid is 1:10:20.

19. The method for manufacturing a substrate according to claim 11,
wherein the volume ratio between hydrofluoric acid, nitric acid, and acetic acid is 1:1:10.

20. The method for reprocessing a semiconductor substrate according to claim 1,
wherein the semiconductor substrate is a silicon substrate.

21. The method for manufacturing a substrate according to claim 11,
wherein the semiconductor substrate is a silicon substrate.

* * * * *